US012740198B2

(12) United States Patent
Kim

(10) Patent No.: US 12,740,198 B2
(45) Date of Patent: Sep. 15, 2026

(54) INK INCLUDING LIGHT-EMITTING ELEMENTS, DISPLAY DEVICE AND METHOD OF FABRICATING THE SAME

(71) Applicant: Samsung Display Co., LTD., Yongin-si (KR)

(72) Inventor: Si Kwang Kim, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 1121 days.

(21) Appl. No.: 17/407,376

(22) Filed: Aug. 20, 2021

(65) Prior Publication Data

US 2022/0115565 A1 Apr. 14, 2022

(30) Foreign Application Priority Data

Oct. 8, 2020 (KR) ........................ 10-2020-0130263

(51) Int. Cl.

*H10H 20/84* (2025.01)
*H10W 90/00* (2026.01)
*H10H 20/01* (2025.01)
*H10H 20/852* (2025.01)

(52) U.S. Cl.

CPC ............ *H10H 20/84* (2025.01); *H10W 90/00* (2026.01); *H10H 20/034* (2025.01); *H10H 20/0362* (2025.01); *H10H 20/852* (2025.01)

(58) Field of Classification Search

CPC .. H10H 20/84; H10H 20/034; H10H 20/0362; H10H 20/852; H10H 29/8321; H10H 29/842; H10W 90/00; C09D 11/50; C09D 11/10; H10D 86/40

See application file for complete search history.

(56) References Cited

U.S. PATENT DOCUMENTS 12,155,022 B2 11/2024 Do et al.
2009/0315965 A1* 12/2009 Yamagata .................. B41J 2/45 257/98
2017/0138549 A1* 5/2017 Do ............................ F21K 9/64
2018/0019377 A1* 1/2018 Kim ................... H10H 20/8252
2018/0175009 A1 6/2018 Kim et al.
2018/0175104 A1* 6/2018 Kang ..................... H10H 29/10
2018/0175106 A1 6/2018 Kim et al.
2019/0115513 A1* 4/2019 Im .......................... H05K 1/111
2021/0376210 A1 12/2021 Lee et al.

FOREIGN PATENT DOCUMENTS

EP 3 944 324 1/2022
KR 10-2020-0063399 6/2020
KR 10-2020-0088946 A 7/2020
KR 10-2020-0111312 A 9/2020
WO 2020/130249 6/2020
WO 2020/189924 9/2020

OTHER PUBLICATIONS

Extended European search report for European Patent Application or Patent No. 21201635.6 dated Mar. 9, 2022.
Korean Notice of Allowance issued in corresponding Korean Patent Application 10-2020-0130263, dated Oct. 24, 2025, 2 pages.

* cited by examiner

*Primary Examiner* — Su C Kim
(74) *Attorney, Agent, or Firm* — Womble Bond Dickinson (US) LLP

(57) ABSTRACT

An ink includes a solvent, light-emitting elements included in the solvent, and polymer resins included in the solvent. Each of the light-emitting elements includes semiconductor layers, and an insulating film at least partially surrounding outer surfaces of the semiconductor layers.

18 Claims, 21 Drawing Sheets

FIG. 3

INK INCLUDING LIGHT-EMITTING ELEMENTS, DISPLAY DEVICE AND METHOD OF FABRICATING THE SAME

CROSS-REFERENCE TO RELATED APPLICATION(S)

This application claims priority to and benefits of Korean Patent Application No. 10-2020-0130263 under 35 U.S.C. § 119, filed on Oct. 8, 2020, in the Korean Intellectual Property Office, the entire contents of which are incorporated herein by reference.

BACKGROUND

1. Technical Field

The disclosure relates to an ink including light-emitting elements, a display device and a method of fabricating the same.

2. Description of the Related Art

Display devices become more and more important as multimedia technology evolves. Accordingly, a variety of types of display devices such as organic light-emitting display (OLED) devices and liquid-crystal display (LCD) devices are currently used.

Display devices may display images and include a display panel such as an organic light-emitting display panel or a liquid-crystal display panel. Among display panel types, light-emitting display panels may include light-emitting elements, such as light-emitting diodes. For example, light-emitting diodes (LEDs) may include an organic light-emitting diode (OLED) using an organic material as a fluorescent material, and an inorganic light-emitting diode using an inorganic material as a fluorescent material.

SUMMARY

Aspects of the disclosure provide an ink including light-emitting elements that can prevent the aligned light-emitting elements from being detached.

Aspects of the disclosure also provide a method of fabricating a display device that can simplify the processes by using the ink including light-emitting elements, and a display device fabricated by the method.

It should be noted that aspects of the disclosure are not limited to the above. Additional aspects will be apparent to those skilled in the art from the following descriptions.

According to embodiments of the disclosure, a first organic insulating layer and a second organic insulating layer may be disposed on and under light-emitting elements, respectively, so that the light-emitting elements can be adhered and fixed to a first passivation layer. In this manner, it may be possible to prevent the light-emitting elements from being detached during a cleaning process performed after the light-emitting elements have been aligned.

According to an embodiment of the disclosure, a first organic insulating layer, a second organic insulating layer and a second insulating layer in the display device may be made of an organic material. The first organic insulating layer, the second organic insulating layer, and the second insulating layer can be patterned via a single etching process, thereby simplifying the processes.

It should be noted that effects of the disclosure are not limited to those described above and other effects of the disclosure will be apparent to those skilled in the art from the following descriptions.

According to an embodiment of the disclosure, ink may comprise a solvent, light-emitting elements included in the solvent, each of the light emitting elements comprising semiconductor layers, and an insulating film at least partially surrounding outer surfaces of the semiconductor layers, and polymer resins included in the solvent.

In an embodiment, the polymer resins may comprise at least one selected from the group of acrylic-based, epoxy-based, phenol-based, polyamide, polyimide, unsaturated polyester, polyphenylene, polyphenylene sulfide, benzocyclobutene, cardo, siloxane, silsesquioxane, polymethyl methacrylate, and polycarbonate.

In an embodiment, the polymer resins may be included in the ink in an amount of about 1 to about 10 parts by weight based on 100 parts by weight of the ink.

In an embodiment, the light-emitting elements may be included in the ink in an amount of about 0.01 to about 1 parts by weight based on 100 parts by weight of the ink.

According to an embodiment of the disclosure, a display device may comprise a substrate, a first electrode and a second electrode that extend in a direction on the substrate and are spaced apart from each other, a first passivation layer disposed on the substrate and overlapping the first electrode and the second electrode, at least one light-emitting element disposed on the first passivation layer and having ends disposed on the first electrode and the second electrode, respectively, a first organic insulating layer disposed between the first passivation layer and the at least one light-emitting element, and a second organic insulating layer disposed on the at least one light-emitting element.

In an embodiment, the first organic insulating layer may overlap the at least one light-emitting element, and a planar size of the first organic insulating layer may be larger than a planar size of the at least one light-emitting element.

In an embodiment, the first organic insulating layer may overlap the at least one light-emitting element in the direction.

In an embodiment, the first organic insulating layer may extend to the first passivation layer and the at least one light-emitting element.

In an embodiment, the at least one light-emitting element may be spaced apart from the first passivation layer.

In an embodiment, at least a portion of the at least one light-emitting element extends to the first passivation layer, and another portion of the at least one light-emitting element extends to the first organic insulating layer.

In an embodiment, the second organic insulating layer may overlap the first organic insulating layer and the at least one light-emitting element, and may extend to the at least one light-emitting element.

In an embodiment, the second organic insulating layer may continuously overlap the at least one light-emitting element in the direction.

In an embodiment, a width of portions of the first organic insulating layer that overlap the at least one light-emitting element may be larger than a width of the second organic insulating layer in a longitudinal direction of the at least one light-emitting element.

In an embodiment, the display device may further comprise a second passivation layer disposed on the second organic insulating layer, wherein the second organic insulating layer and the second passivation layer overlap each other and have a same size.

In an embodiment, the first organic insulating layer and the second organic insulating layer may be made of a same material.

In an embodiment, the display device may further comprise a first contact electrode disposed on the first electrode and electrically contacting a first end of the at least one light-emitting element, and a second contact electrode disposed on the second electrode and electrically contacting a second end of the at least one light-emitting element.

In an embodiment, the display device may further comprise a second passivation layer disposed on the second organic insulating layer, wherein the first contact electrode may extend to an end of each of the second organic insulating layer and the second passivation layer, the second contact electrode extends to another end of each of the second organic insulating layer and the second passivation layer, and the first contact electrode and the second contact electrode may not extend to an upper surface of the second passivation layer.

According to an embodiment of the disclosure, a method of fabricating a display device may comprise preparing an ink including a solvent, light-emitting elements, and polymer resins, forming a first electrode and a second electrode on a substrate, forming a passivation layer on the first electrode and the second electrode, ejecting the ink onto the substrate, applying an electric field over the substrate to align the light-emitting elements on the first electrode and the second electrode, removing the solvent, forming a first organic layer surrounding the light-emitting elements, forming a second organic layer on the first organic layer, forming a mask pattern on the second organic layer, and etching the first organic layer and the second organic layer.

In an embodiment, the method may further comprise, after the etching of the first organic layer and the second organic layer, disposing an electrode material layer on the substrate, and etching the electrode material layer using a photoresist pattern.

In an embodiment, the forming of the first organic layer may include performing heat treatment on the polymer resins.

BRIEF DESCRIPTION OF THE DRAWINGS

The above and other aspects and features of the disclosure will become more apparent by describing in detail embodiments thereof with reference to the attached drawings, in which:

FIG. 3 is a schematic cross-sectional view taken along lines Q1-Q1', Q2-Q2' and Q3-Q3' of FIG. 2.

DETAILED DESCRIPTION OF THE EMBODIMENTS

Figure 1:
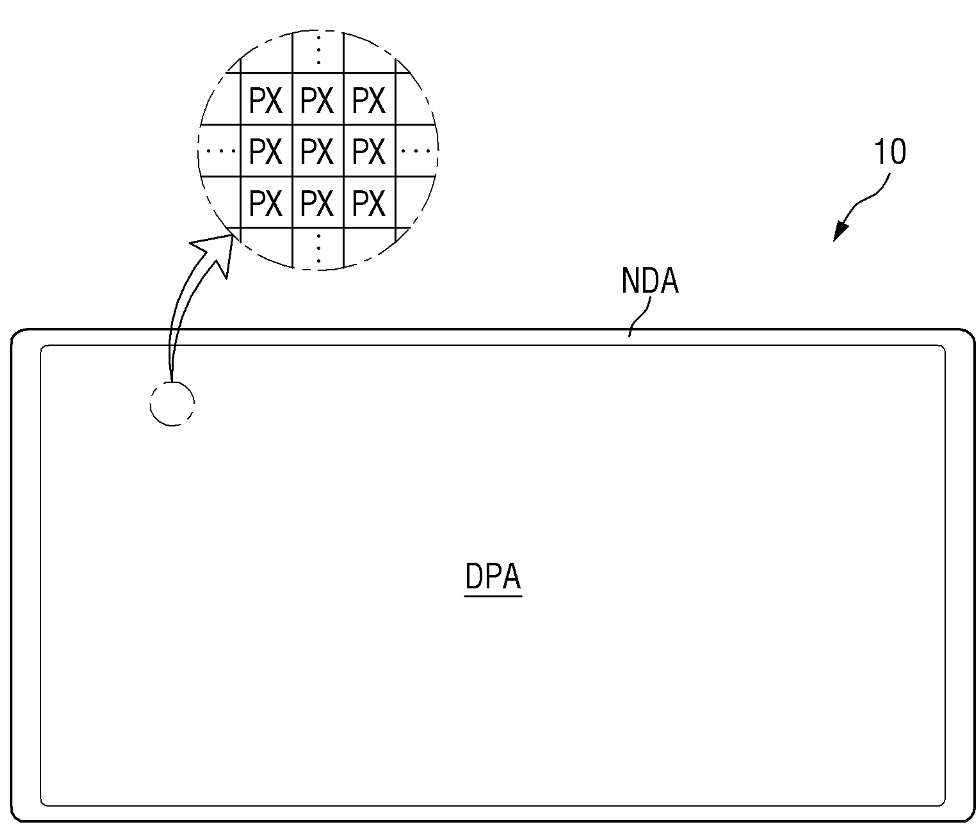
FIG. 1 is a plan view schematically showing a display device according to an embodiment of the disclosure.
Figure 1:
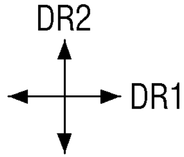

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

As used herein, the singular forms, "a," "an," and "the" are intended to include the plural forms as well (and vice versa), unless the context clearly indicates otherwise. In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." The phrase "at least one of" is intended to include the meaning of "at least one selected from the group of" for the purpose of its meaning and interpretation. For example, "at least one of A and B" may be understood to mean "A, B, or A and B."

It will also be understood that when a feature (e.g., layer) is referred to as being "on" another layer or substrate, it can be directly on the other layer or substrate, or intervening features may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

It will be understood that the terms "connected to" or "coupled to" may include a physical or electrical connection or coupling.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

Each of the features of the various embodiments of the disclosure may be combined or combined with each other, in part or in whole, and technically various interlocking and driving may be possible. Each embodiment may be implemented independently of each other or may be implemented together in an association.

Terms such as "about", "approximately", and "substantially" as used herein are inclusive of the stated value and may mean within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a plan view schematically showing a display device according to an embodiment of the disclosure.

Referring to FIG. 1, the display device 10 may display a moving image or a still image. The display device 10 may refer to any electronic device that provides a display screen. For example, the display device 10 may include a television set, a laptop computer, a monitor, an electronic billboard, an Internet of Things devices, a mobile phone, a smart phone, a tablet personal computer (PC), an electronic watch, a smart watch, a watch phone, a head-mounted display device, a mobile communications terminal, an electronic notebook, an electronic book, a portable multimedia player (PMP), a navigation device, a game console, a digital camera, a camcorder, etc.

The display device 10 may include a display panel for providing a display screen. Examples of the display panel may include an inorganic light-emitting diode display panel, an organic light-emitting display panel, a quantum-dot light-emitting display panel, a plasma display panel, a field emission display panel, etc. In the following description, an inorganic light-emitting diode display panel may be employed as an example of the display panel 10, but the disclosure is not limited thereto. Any other display panel may be employed as long as technical ideas of the disclosure can be equally applied.

The shape of the display device 10 may be modified in a variety of ways. For example, the display device 10 may have shapes such as a rectangle with longer lateral sides, a rectangle with longer vertical sides, a square, a quadrangle with rounded corners (vertices), other polygons, a circle, etc. The shape of a display area DPA of the display device 10 may also be similar to the overall shape of the display device 10. FIG. 1 shows the display device 1 in the shape of a rectangle with longer horizontal sides and the display area DPA.

The display device 10 may include the display area DPA and a non-display area NDA. In the display area DPA, images can be displayed. In the non-display area NDA, images may not be displayed. The display area DPA may be referred to as an active area, while the non-display area NDA may be referred to as an inactive area. The display area DPA may generally occupy a center of the display device 10.

The display area DPA may include pixels PX. The pixels PX may be arranged in a matrix. The shape of each pixel PX may be, but is not limited to, a rectangle or a square when viewed from the top. Each pixel may have a diamond shape having sides inclined with respect to a direction. The pixels PX may be arranged in stripes and a PenTile® pattern alternately. Each of the pixels PX may include at least one light-emitting element 30 that emits light of a particular wavelength band to represent a color.

The non-display area NDA may be disposed adjacent to (e.g., around) the display area DPA. The non-display area NDA may surround the display area DPA entirely or partially. The display area DPA may have a rectangular shape, and the non-display area NDA may be disposed to be adjacent to the four sides of the display area DPA. The non-display area NDA may form a bezel of the display device 10. Lines or circuit drivers included in the display device 10 may be disposed in each of the non-display area NDA, or external devices may be mounted.

Figure 2:
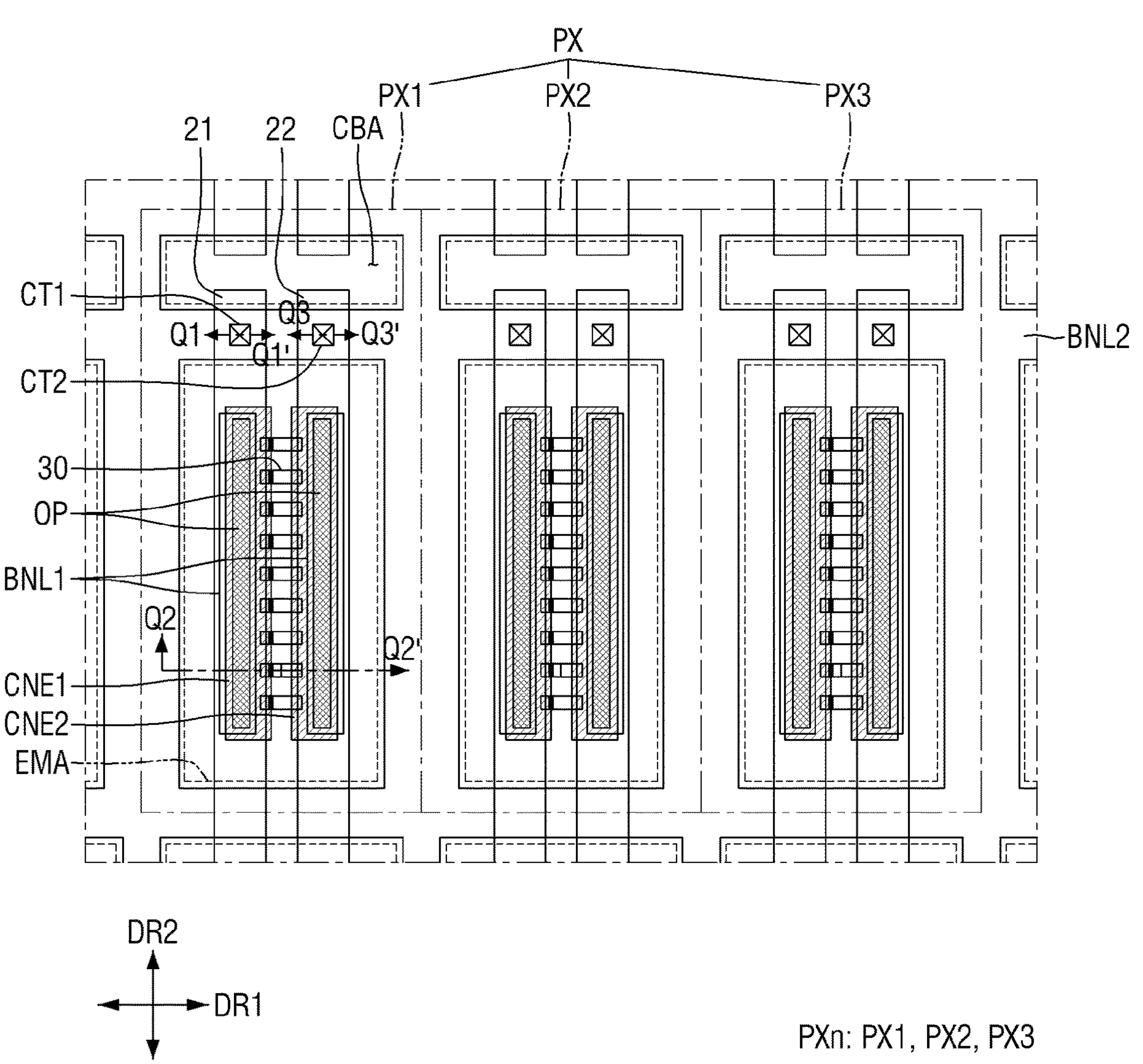
FIG. 2 is a plan view schematically showing a pixel of a display device according to an embodiment of the disclosure.

FIG. 2 is a plan view schematically showing a pixel of a display device according to an embodiment of the disclosure.

Referring to FIG. 2, each of the pixels PX may include sub-pixels PXn, where n may be an integer from one to three. For example, a pixel PX may include a first sub-pixel PX1, a second sub-pixel PX2 and a third sub-pixel PX3. The first sub-pixel PX1 may emit light of a first color, the second sub-pixel PX2 may emit light of a second color, and the third sub-pixel PX3 may emit light of a third color. For example, the first color may be blue, the second color may be green, and the third color may be red. It is, however, to be understood that the disclosure is not limited thereto. All the sub-pixels PXn may emit light of the same color. Although the pixel PX includes three sub-pixels PXn in the example shown in FIG. 2, the disclosure is not limited thereto. The pixel PX may include more than two sub-pixels PXn.

Each of the sub-pixels PXn of the display device 10 may include an emission area EMA and a non-emission area. In the emission area EMA, the light-emitting elements 30 may be disposed to emit light of a particular wavelength. In the non-emission area, no light-emitting element 30 may be disposed and light emitted from the light-emitting elements 30 may not reach and thus no light exits therefrom. The emission area may include an area in which the light-emitting elements 30 may be disposed, and may include an area adjacent to the light-emitting elements 30 where light emitted from the light-emitting elements 30 may exit.

It is, however, to be understood that the disclosure is not limited thereto. The emission area may also include an area in which light emitted from the light-emitting elements 30 may be reflected or refracted by other elements to exit. The light-emitting elements 30 may be disposed in each of the sub-pixels PXn, and the emission area may include the area where the light-emitting elements are disposed and the adjacent area.

Each of the sub-pixels PXn may further include a cut area CBA disposed in the non-emission area. The cut area CBA may be disposed on a side of the emission area EMA in the second direction DR2. The cut area CBA may be disposed between the emission areas EMA of neighboring sub-pixels PXn in the second direction DR2. In the display area DPA of the display device 10, emission areas EMA and cutout areas CBA may be arranged. For example, the emission areas EMA and the cutout areas CBA may be arranged repeatedly in the first direction DR1, and may be arranged alternately in the second direction DR2. The spacing between the cutout areas CBA in the first direction DR1 may be smaller than the spacing between the emission areas EMA in the first direction DR1. A second bank BNL2 may be disposed between the cutout regions CBA and the emission areas EMA, and the distance between them may vary depending on the width of the second bank BNL2. Although the light-emitting elements 30 may not be disposed in the cutout areas CBA and thus no light may exit therefrom, parts of the electrodes 21 and 22 disposed in each of the sub-pixels PXn may be disposed in the cutout areas CBA. The electrodes 21 and 22 disposed for each of the sub-pixels PXn may be disposed separately from each other in the cut area CBA.

Figure 3:
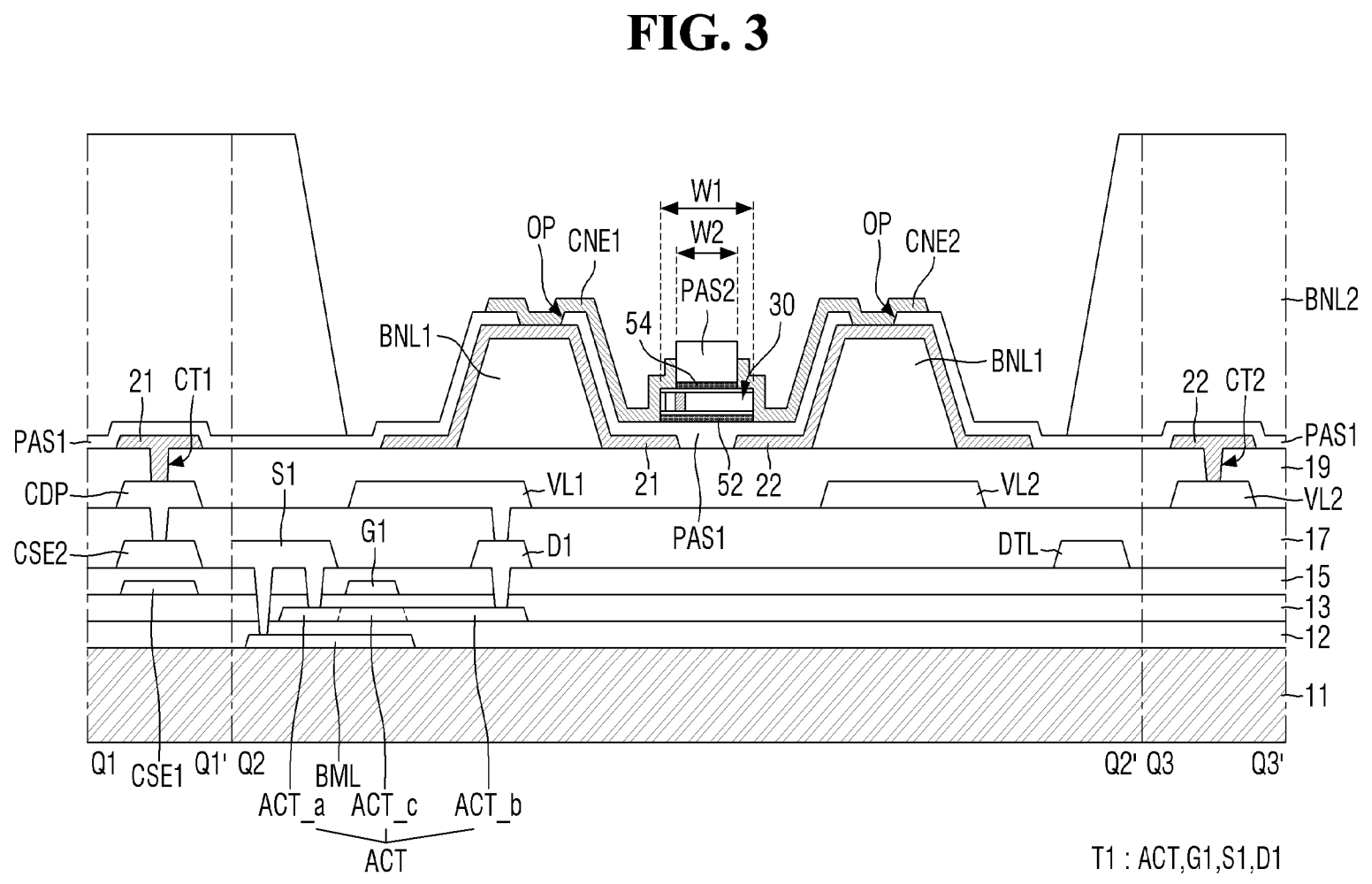

FIG. 3 is a schematic cross-sectional view taken along lines Q1-Q1', Q2-Q2' and Q3-Q3' of FIG. 2. FIG. 3 is a view showing a cross section from one end to the other end of the light-emitting element 30 disposed in the first sub-pixel PX1 of FIG. 2.

Referring to FIG. 3 in conjunction with FIG. 2, the display device 10 may include a first substrate 11, a semiconductor layer disposed on the first substrate 11, conductive layers, and insulating layers. The semiconductor layer, the conductive layers and the insulating layers may form a circuit layer and an emission layer of the display device 10.

Specifically, the first substrate 11 may be an insulating substrate. The first substrate 11 may be made of an insulating material such as glass, quartz, a polymer resin, or a combination thereof. The first substrate 11 may be either a rigid substrate or a flexible substrate that can be bent, folded, and/or rolled.

The light-blocking layer BML may be disposed on the first substrate 11. The light-blocking layer BML may overlap an active layer ACT of a first transistor T1 of the display device 10. The light-blocking layer BML may include a material that blocks light, and thus can prevent light from entering the active layer ACT of the first transistor T1. For example, the light-blocking layer BML may be formed of an opaque metal material that blocks light transmission. It is, however, to be understood that the disclosure is not limited thereto. In some embodiments, the light-blocking layer BML may be eliminated.

The buffer layer 12 may be disposed on (e.g., entirely on) the first substrate 11, including the light-blocking layer BML. The buffer layer 12 may be formed on the first substrate 11 to protect the first thin-film transistors T1 of the pixels PX from moisture permeating through the first substrate 11 that may be susceptible to moisture permeation, and may also provide a flat surface. The buffer layer 12 may be formed of inorganic layers stacked on one another alternately. For example, the buffer layer 12 may be made up of multiple layers in which inorganic layers including at least one of a silicon oxide (SiOx), a silicon nitride (SiNx) and silicon oxynitride (SiOxNy) may be stacked on one another alternately.

The semiconductor layer may be disposed on the buffer layer 12. The semiconductor layer may include the active layer ACT of the first transistor T1. These may be disposed to partially overlap a gate electrode G1 of a first gate conductive layer, etc., which will be described later.

Although only the first transistor T1 among the transistors included in the sub-pixels PXn of the display device 10 is depicted in the drawing, the disclosure is not limited thereto. The display device 10 may include a larger number of transistors. For example, the display device 10 may include one or more transistors in addition to the first transistor T1, e.g., two or three transistors in each of the sub-pixels PXn.

The semiconductor layer may include polycrystalline silicon, monocrystalline silicon, an oxide semiconductor, etc., or a combination thereof. In case that the semiconductor layer includes an oxide semiconductor, each active layer ACT may include conductive regions ACT_a and ACT_b and a channel region ACT_c therebetween. The oxide semiconductor may be an oxide semiconductor including indium (In). For example, the oxide semiconductor may be indium-tin oxide (ITO), indium-zinc oxide (IZO), indium-gallium oxide (IGO), indium-zinc-tin oxide (IZTO), indium-gallium-tin oxide (IGTO), indium-gallium-zinc oxide (IGZO), indium-gallium-zinc-tin oxide (IGZTO), etc.

In other embodiments, the semiconductor layer may include polycrystalline silicon. The polycrystalline silicon may be formed by crystallizing amorphous silicon, and the conductive regions of the active layer ACT may be doped regions doped with impurities.

The first gate insulating layer 13 may be disposed on the semiconductor layer and the buffer layer 12. The first gate insulating layer 13 may include a semiconductor layer, and may be disposed on the buffer layer 12. The first gate insulating layer 13 may work as a gate insulator of each of the thin-film transistors. The first gate insulating layer 13 may be formed of an inorganic layer including an inorganic material, such as silicon oxide (SiOx), silicon nitride (SiNx) and silicon oxynitride (SiOxNy), or may be formed of a stack of the materials.

The first gate conductive layer may be disposed on the first gate insulating layer 13. The first gate conductive layer may include the gate electrode G1 of the first transistor T1 and a first capacitor electrode CSE1 of a storage capacitor. The gate electrode G1 may be disposed so that it overlaps the channel region ACT_c of the active layer ACT in the thickness direction. The first capacitor electrode CSE1 may be disposed so that it overlaps a second capacitor electrode CSE2 (described later) in the thickness direction. According to an embodiment of the disclosure, the first capacitor electrode CSE1 may be integrated with the gate electrode G1. The first capacitor electrode CSE1 may be disposed so that it overlaps the second capacitor electrode CSE2 in the thickness direction, and the storage capacitor may be formed between them.

The first gate conductive layer may be made up of a single layer or multiple layers of molybdenum (Mo), aluminum (Al), chromium (Cr), gold (Au), titanium (Ti), nickel (Ni), neodymium (Nd) and copper (Cu) or an alloy thereof. It is, however, to be understood that the disclosure is not limited thereto.

The first interlayer dielectric layer 15 may be disposed on the first gate conductive layer. The first interlayer dielectric layer 15 may serve as an insulating layer between the first gate conductive layer and other layers disposed thereon. The first interlayer dielectric layer 15 may be disposed so that it overlaps (e.g., covers) the first gate conductive layer for protection. The first interlayer dielectric layer 15 may be formed of an inorganic layer including an inorganic material, such as silicon oxide (SiOx), silicon nitride (SiNx) and silicon oxynitride (SiOxNy), or may be formed of a stack of the materials.

The first data conductive layer may be disposed on the first interlayer dielectric layer 15. The first data conductive layer may include a first source electrode S1 and a first drain electrode D1 of the first transistor T1, a data line DTL, and a second capacitor electrode CSE2.

The first source electrode S1 and the first drain electrode D1 of the first transistor T1 may be in contact with the doped regions ACT_a and ACT_b of the active layer ACT, respectively, through the contact holes penetrating through the first interlayer dielectric layer 15 and the first gate insulating layer 13. The first source electrode S1 of the first transistor T1 may be electrically connected to the light-blocking layer BML through another contact hole.

The data line DTL may apply a data signal to another transistor (not shown) included in the display device 10. Although not shown in the drawings, the data line DTL may be connected to the source/drain electrodes of another transistor to transfer a signal applied from the data line DTL.

The second capacitor electrode CSE2 may be disposed to overlap the first capacitor electrode CSE1 in the thickness direction. According to an embodiment of the disclosure, the second capacitor electrode CSE2 may be integrally connected to the first source electrode S1.

The first data conductive layer may be made up of a single layer or multiple layers of molybdenum (Mo), aluminum (Al), chromium (Cr), gold (Au), titanium (Ti), nickel (Ni), neodymium (Nd) and copper (Cu) or an alloy thereof. It is, however, to be understood that the disclosure is not limited thereto.

The second interlayer dielectric layer 17 may be disposed on the first data conductive layer. The second interlayer dielectric layer 17 may serve as an insulating layer between the first data conductive layer and other layers disposed thereon. The second interlayer dielectric layer 17 may cover the first data conductive layer to protect it. The second interlayer dielectric layer 17 may be formed of an inorganic layer including an inorganic material, such as silicon oxide (SiOx), silicon nitride (SiNx) and silicon oxynitride (SiOxNy), or may be formed of a stack of the materials.

The second data conductive layer may be disposed on the second interlayer dielectric layer 17. The second data conductive layer may include a first voltage line VL1, a second voltage line VL2, and a first conductive pattern CDP. A high-level voltage (or a first supply voltage) may be applied to the first voltage line VL1 to be supplied to the first transistor T1, and a low-level voltage (or a second supply voltage) may be applied to the second voltage line VL2 to be supplied to the second electrode 22. An alignment signal that may be necessary for aligning the light-emitting elements 30 during the process of fabricating the display device 10 may be applied to the second voltage line VL2.

The first conductive pattern CDP may be connected to the second capacitor electrode CSE2 through a contact hole formed in the second interlayer dielectric layer 17. The second capacitor electrode CSE2 may be integrated with the first source electrode S1 of the first transistor T1, and the first conductive pattern CDP may be electrically connected to the first source electrode S1. The first conductive pattern CDP may also come in contact with the first electrode 21 to be described later. The first transistor T1 may transfer the first supply voltage applied from the first voltage line VL1 to the first electrode 21 through the first conductive pattern CDP. Although the second data conductive layer includes one second voltage line VL2 and one first voltage line VL1 in the example shown in the drawings, the disclosure is not limited thereto. The second data conductive layer may include more than one first voltage lines VL1 and second voltage lines VL2.

The second data conductive layer may be made up of a single layer or multiple layers of molybdenum (Mo), aluminum (Al), chromium (Cr), gold (Au), titanium (Ti), nickel (Ni), neodymium (Nd) and copper (Cu) or an alloy thereof. It is, however, to be understood that the disclosure is not limited thereto.

The first planarization layer 19 may be disposed on the second data conductive layer. The first planarization layer 19 may include an organic insulating material, e.g., an organic material such as polyimide (PI), to provide a flat surface.

On the first planarization layer 19, first banks BNL1, electrodes 21 and 22, a light-emitting elements 30, contact electrodes CNE1 and CNE2, and a second bank BNL2 may be disposed. Insulating layers PAS1 and PAS2 may be disposed on the first planarization layer 19.

The first banks BNL1 may be disposed directly on the first planarization layer 19. The first banks BNL1 may have a shape extended in the second direction DR2 within each of the sub-pixels PXn, and may not be extended to an adjacent sub-pixel PXn in the second direction DR2. They may be disposed in the emission area EMA. The first banks BNL1 may be spaced apart from each other in the first direction DR1, and the light-emitting elements 30 may be disposed therebetween. The first banks BNL1 may be disposed in each of the sub-pixels PXn to form a linear pattern in the display area DPA of the display device 10. Although two first banks BNL1 are shown in the drawings, the disclosure is not limited thereto. More than two first banks BNL1 may be disposed depending on the number of electrodes 21 and 22.

The first banks BNL1 may have a structure that at least partly protrudes from the upper surface of the first planarization layer 19. The protrusions of the first banks BNL1 may have inclined side surfaces. The light emitted from the light-emitting elements 30 may be reflected by the electrodes 21 and 22 disposed on the first banks BNL1 so that the light may exit toward the upper side of the first planarization layer 19. The first banks BNL1 may provide the area in which the light-emitting element 30 may be disposed and may also serve as reflective partition walls that reflect light emitted from the light-emitting element 30 upward. The side surfaces of the first banks BNL1 may be inclined in a linear shape, but the disclosure is not limited thereto. The first banks BNL1 may have a semicircle or semi-ellipse shape with curved outer surface. The first banks BNL1 may include, but are not limited to, an organic insulating material such as polyimide (PI).

The electrodes 21 and 22 may be disposed on the first banks BNL1 and the first planarization layer 19. The electrodes 21 and 22 may include the first electrode 21 and the second electrode 22. The electrodes 21 and 22 may be extended in the second direction DR2 and may be spaced apart from each other in the first direction DR1.

The first electrode 21 and the second electrode 22 may be extended in the second direction DR2 in each of the sub-pixels PXn, and they may be spaced apart from other electrodes 21 and 22 in the cut area CBA. For example, the cut area CBA may be disposed between the emission areas EMA of the neighboring sub-pixels PXn in the second direction DR2, and the first electrode 21 and the second electrode 22 may be separated from other first electrode 21 and second electrode 22 disposed in an adjacent sub-pixel PXn in the second direction DR2 in the cut area CBA. It is, however, to be understood that the disclosure is not limited thereto. Some electrodes 21 and 22 may not be separated for each of the sub-pixels PXn but may be extended and disposed across adjacent sub-pixels PXn in the second direction DR2. In other embodiments, only one of the first electrode 21 and the second electrode 22 may be separated.

The first electrode 21 may be electrically connected to the first transistor T1 through a first contact hole CT1, and the second electrode 22 may be electrically connected to the second voltage line VL2 through a second contact hole CT2. For example, an extended portion of the first electrode 21 in the first direction DR1 of the second bank BNL2 may be in contact with the first conductive pattern CDP through the first contact hole CT1 penetrating through the first planarization layer 19. An extended portion of the second electrode 22 in the first direction DR1 of the second bank BNL2 may be in contact with the second voltage line VL2 through the second contact hole CT2 penetrating through the first planarization layer 19. It is, however, to be understood that the disclosure is not limited thereto. According to another embodiment, the first contact hole CT1 and the second contact hole CT2 may be formed in the emission area EMA surrounded by the second bank BNL2 so that they do not overlap the second bank BNL2.

Although one first electrode 21 and one second electrode 22 may be disposed for each of the sub-pixels PXn in the drawings, the disclosure is not limited thereto. More than one first electrode 21 and more than one second electrodes 22 may be disposed in each of the sub-pixels PXn. The first electrode 21 and the second electrode 22 disposed in each of the sub-pixels PXn may not necessarily have a shape extended in one direction but may have a variety of structures. For example, the first electrode 21 and the second electrode 22 may have a partially curved or bent shape, and an electrode may be disposed to surround another electrode.

The first electrode 21 and the second electrode 22 may be disposed directly on the first banks BNL1, respectively. The first electrode 21 and the second electrode 22 may have a larger width than the first banks BNL1. For example, the first electrode 21 and the second electrode 22 may be disposed to cover the outer surfaces of the first banks BNL1. The first electrode 21 and the second electrode 22 may be respectively disposed on the side surfaces of the first banks BNL1, and the distance between the first electrode 21 and the second electrode 22 may be smaller than the distance between the first banks BNL1. At least a portion of the first electrode 21 and the second electrode 22 may be disposed directly on the first planarization layer 19 so that they may be located on the same plane. It is, however, to be understood that the disclosure is not limited thereto. In some embodiments, the electrodes 21 and 22 may have a width smaller than that of the first banks BNL1. It is to be noted that the electrodes 21 and 22 may be disposed to cover at least one side surface of the first banks BNL1 to reflect light emitted from the light-emitting element 30.

Each of the electrodes 21 and 22 may include a conductive material having a high reflectance. For example, each of the electrodes 21 and 22 may include at least one metal such as silver (Ag), copper (Cu) and aluminum (Al) as the material having a high reflectance, and may be an alloy including aluminum (Al), nickel (Ni), lanthanum (La), etc. Each of the electrodes 21 and 22 may reflect light that may be emitted from the light-emitting element 30 and travel toward the side surfaces of the first banks BNL1 toward the upper side of each of the sub-pixels PXn.

It is, however, to be understood that the disclosure is not limited thereto. Each of the electrodes 21 and 22 may further include a transparent conductive material. For example, each of the electrodes 21 and 22 may include a material such as indium tin oxide (ITO), indium zinc oxide (IZO) and indium tin zinc oxide (ITZO). In some embodiments, each of the electrodes 21 and 22 may have a structure in which one or more layers of a transparent conductive material and a metal layer having high reflectivity may be stacked, or may be made up of a single layer. For example, each of the electrodes 21 and 22 may have a stack structure such as ITO/silver (Ag)/ITO/, ITO/Ag/IZO, or ITO/Ag/ITZO/IZO.

The electrodes 21 and 22 may be electrically connected to the light-emitting elements 30, and a voltage may be applied so that the light-emitting elements 30 can emit light. The electrodes 21 and 22 may be electrically connected to the light-emitting element 30 through the contact electrodes CNE1 and CNE2, and may transfer electrical signals applied thereto to the light-emitting element 30 through the contact electrodes CNE1 and CNE2.

The first electrode 21 or the second electrode 22 may be electrically connected to an anode electrode of the light-emitting element 30, while another may be electrically connected to a cathode electrode of the light-emitting element 30. It is, however, to be understood that the disclosure is not limited thereto.

The electrodes 21 and 22 may be utilized to form an electric field within the sub-pixel PXn to align the light-emitting elements 30. The light-emitting elements 30 may be disposed between the first electrode 21 and the second electrode 22 by an electric field formed on the first electrode 21 and the second electrode 22. The light-emitting elements 30 of the display device 10 may be sprayed on the electrodes 21 and 22 via an inkjet printing process. In case that droplets of the ink including the light-emitting elements 30 are ejected onto the electrodes 21 and 22, an alignment signal may be applied to the electrodes 21 and 22 to generate an electric field. The light-emitting elements 30 dispersed in the ink may be aligned on the electrodes 21 and 22 by receiving the electrophoretic force by the electric field generated over the electrodes 21 and 22.

The first passivation layer PAS1 may be disposed on the first planarization layer 19. The first passivation layer PAS1 may be disposed to cover the first banks BNL1 and the first electrode 21 and the second electrode 22. The first passivation layer PAS1 can protect the first electrode 21 and the second electrode 22 and insulate the first and second electrodes 21, 22 from each other. The first passivation layer PAS1 can prevent that the light-emitting element 30 disposed on the first passivation layer PAS1 may be brought into contact with other elements and damaged.

According to an embodiment of the disclosure, the first passivation layer PAS1 may include openings OP partially exposing the first electrode 21 and the second electrode 22. The openings OP may partially expose portions of the electrodes 21 and 22 disposed on the upper surface of the first banks BNL1. Portions of the contact electrodes CNE1 and CNE2 may be in contact with the electrodes 21 and 22 exposed through the openings OP, respectively.

The second bank BNL2 may be disposed on the first passivation layer PAS1. The second bank BNL2 may be disposed in a lattice pattern on the surface (e.g., entire surface) of the display area DPA including portions extended in the first direction DR1 and the second direction DR2 when viewed from the top. The second bank BNL2 may be disposed along the border of each of the sub-pixels PXn to distinguish adjacent sub-pixels PXn from one another.

The second bank BNL2 may be disposed to surround the emission area EMA and the cut area CBA disposed in each of the sub-pixels PXn to distinguish such features. The first electrode 21 and the second electrode 22 may be extended in the second direction DR2 and may be disposed across a portion of the second bank BNL2 that may be extended in the first direction DR1. The portion of the second bank BNL2 extended in the second direction DR2 may have a larger width between the emission areas EMA than between the cut areas CBA. Accordingly, the distance between the cut areas CBA may be smaller than the distance between the emission areas EMA.

The second bank BNL2 may have a height greater than a height of the first banks BNL1. The second bank BNL2 can prevent the ink in which different light-emitting elements 30 may be dispersed from overflowing to adjacent sub-pixels PXn during the inkjet printing process of the processes of fabricating the display device 10, so that different sub-pixels PXn can be separated from one another and the ink may not be mixed. The second bank BNL2 may include, but is not limited to, polyimide (PI), like the first banks BNL1.

The light-emitting elements 30 may be disposed on the first passivation layer PAS1. The light-emitting elements 30 may be spaced apart from one another in the second direction DR2 in which the electrodes 21 and 22 may be extended, and may be aligned substantially parallel to one another. The light-emitting elements 30 may have a shape extended in one direction. The direction in which the electrodes 21 and 22 may be extended may be substantially perpendicular to the direction in which the light-emitting elements 30 may be extended. It is, however, to be understood that the disclosure is not limited thereto. The light-emitting elements 30 may be oriented obliquely to the direction in which the electrodes 21 and 22 may be extended, rather than being perpendicular thereto.

The light-emitting elements 30 disposed in each of the sub-pixels PXn may include an emissive layer 36 (see FIG. 10) including different materials and may emit lights with different wavelength ranges to the outside. Accordingly, lights of the first color, the second color and the third color may exit from the first sub-pixel PX1, the second sub-pixel PX2 and the third sub-pixel PX3, respectively. It is, however, to be understood that the disclosure is not limited thereto. The sub-pixels PXn may include the same kind of light-emitting elements 30 and may emit light of substantially the same color.

Ends of the elements 30 may be disposed on the electrodes 21 and 22 between the first banks BNL1. The length of the light-emitting elements 30 may be larger than the distance between the first electrode 21 and the second electrode 22, and the ends of the light-emitting elements 30 may be disposed on the first electrode 21 and the second electrode 22, respectively. For example, a first end of each of the light-emitting elements 30 may be located on the first electrode 21, while a second other end thereof may be located on the second electrode 22.

Multiple layers of the light-emitting elements 30 may be disposed in the direction perpendicular to the upper surface of the first substrate 11 or the first planarization layer 19. The light-emitting elements 30 may be arranged such that an extending direction may be parallel to the upper surface of the first planarization layer 19, and semiconductor layers included in the light-emitting elements 30 may be disposed sequentially in the direction parallel to the upper surface of the first planarization layer 19. It is, however, to be understood that the disclosure is not limited thereto. In case that the light-emitting elements 30 have a different structure, semiconductor layers may be arranged in the direction perpendicular to the upper surface of the first planarization layer 19.

Ends of each of the light-emitting elements 30 may be in contact with the contact electrodes CNE1 and CNE2, respectively. For example, a portion of semiconductor layers 31 and 32 (see FIG. 10) or an electrode layer 37 (see FIG. 10) of the light-emitting element 30 may be exposed because an insulating film 38 (see FIG. 10) may not be formed at the end surfaces on the sides of the extending direction, and the exposed portion of the semiconductor layers 31 and 32 or the electrode layer 37 may be in contact with the contact electrode CNE1 and CNE2. It is, however, to be understood that the disclosure is not limited thereto. At least a portion of the insulating film 38 may be removed so that both end surfaces of the semiconductor layers 31 and 32 of the light-emitting element 30 may be partially exposed (see FIG. 10). The exposed side surfaces of the semiconductor layers 31 and 32 (see FIG. 10) may be in contact with the contact electrodes CNE1 and CNE2.

The second passivation layer PAS2 may be partially disposed on the light-emitting elements 30. For example, the second passivation layer PAS2 may have a width smaller than the length of the light-emitting elements 30 and may be disposed on the light-emitting elements 30 so that both ends of the light-emitting elements 30 may be exposed while being surrounded by the second passivation layer PAS2. The second passivation layer PAS2 may be disposed to cover the light-emitting elements 30, the electrodes 21 and 22 and the first passivation layer PAS1 and may be removed so that both ends of the light-emitting elements 30 may be exposed during the process of fabricating the display device 10. The second passivation layer PAS2 may be extended in the second direction DR2 on the first passivation layer PAS1 when viewed from the top, thereby forming a linear or island-like pattern in each of the sub-pixels PXn. The second passivation layer PAS2 can protect the light-emitting elements 30 and fix the light-emitting element 30 during the process of fabricating the display device 10.

The contact electrodes CNE1 and CNE2 may be disposed on the first passivation layer PAS1 and the light-emitting elements 30.

The contact electrodes CNE1 and CNE2 may have a shape extended in one direction and may be disposed on the electrodes 21 and 22. The contact electrodes CNE1 and CNE2 may include a first contact electrode CNE1 disposed on the first electrode 21 and a second contact electrode CNE2 disposed on the second electrode 22. The contact electrodes CNE1 and CNE2 may be disposed spaced apart from each other or facing each other. For example, the first contact electrode CNE1 and the second contact electrode CNE2 may be disposed on the first electrode 21 and the second electrode 22, respectively, and may be spaced apart from each other in the first direction DR1. The contact electrodes CNE1 and CNE2 may form a stripe pattern in the emission area EMA of each of the sub-pixels PXn.

Each of the contact electrodes CNE1 and CNE2 may be in contact with the light-emitting elements 30. The first contact electrode CNE1 may be in contact with the first end of each of the light-emitting elements 30, and the second contact electrode CNE2 may be in contact with the second end of each of the light-emitting elements 30. The semiconductor layers may be exposed at both end surfaces of the light-emitting elements 30 in the extended direction, and the contact electrodes CNE1 and CNE2 may be in electrical contact with the semiconductor layers and may be electrically connected thereto. The first contact electrode CNE1 may be in contact with the first electrode 21 through an opening OP exposing a portion of the upper surface of the first electrode 21, and the second contact electrode CNE2 may be in contact with the second electrode through an opening OP exposing a portion of the upper surface of the second electrode 22.

The width of the contact electrodes CNE1 and CNE2 that may be measured in a direction may be smaller than the width of the electrodes 21 and 22 that may be measured in the direction. The contact electrodes CNE1 and CNE2 may be in contact with first ends and second ends of the light-emitting elements 30 and may cover a portion of the upper surface of each of the first electrode 21 and the second electrode 22. It is, however, to be understood that the disclosure is not limited thereto. The width of the contact electrodes CNE1 and CNE2 may be larger than that of the electrodes 21 and 22 to cover both sides of the electrodes 21 and 22.

The contact electrodes CNE1 and CNE2 may include a transparent, conductive material. For example, the contact electrodes may include ITO, IZO, ITZO, aluminum (Al), etc., or a combination thereof. Light emitted from the light-emitting elements 30 may pass through the contact electrodes CNE1 and CNE2 and travel toward the electrodes 21 and 22. It is, however, to be understood that the disclosure is not limited thereto.

Although the two contact electrodes CNE1 and CNE2 may be disposed in one sub-pixel PXn in the drawings, the disclosure is not limited thereto. The number of the contact electrodes CNE1 and CNE2 may vary depending on the number of electrodes 21 and 22 disposed for each of the sub-pixels PXn.

The above-described first passivation layer PAS1 may include an inorganic insulating material or an organic insulating material. For example, the first passivation layer PAS1 may include an inorganic insulating material such as silicon oxide (SiOx), silicon nitride (SiNx), silicon oxynitride (SiOxNy), aluminum oxide ($Al_2O_3$) aluminum nitride (AlN), or a combination thereof. In other embodiments, the first passivation layer PAS1 may include, as an organic insulating material, an acrylic-based resin, an epoxy-based resin, a phenol-based resin, a polyamide resin, a polyimide resin, an unsaturated polyester resin, a polyphenylene resin, a polyphenylene sulfide resin, benzocyclobutene, a cardo resin, a siloxane resin, a silsesquioxane resin, polymethyl methacrylate, polycarbonate, a polymethyl methacrylate-polycarbonate synthetic resin, etc., or a combination thereof. It is, however, to be understood that the disclosure is not limited thereto.

The second passivation layer PAS2 may include an organic insulating material. In case that the second passivation layer PAS2 is made of an organic insulating material, it may be necessary to perform a process of cleaning the first substrate 11 after the light-emitting elements 30 have been aligned and before the organic insulating material may be coated. Unfortunately, during the process of cleaning the first substrate 11, the light-emitting elements 30 aligned on the first substrate 11 may be detached. To prevent detachment, it may be contemplated to form an inorganic insulating material on the light-emitting elements 30 to fix the light-emitting elements 30, and to form an organic insulating material. However, such an approach requires etching the organic insulating material and the inorganic insulating material separately. As a result, processes become complicated and productivity may decrease.

According to an embodiment of the disclosure, an ink including light-emitting elements and polymer resins may be prepared, and may be printed on the first substrate 11, so that a first organic insulating layer 52 and a second organic insulating layer 54 may be formed under and on the light-emitting elements 30, respectively. In this manner, the light-emitting elements 30 can be fixed. The ink and the method of fabricating a display device will be described later. Structures of the first organic insulating layer 52 and the second organic insulating layer 54 will be described with reference to the drawings.

Figure 4:
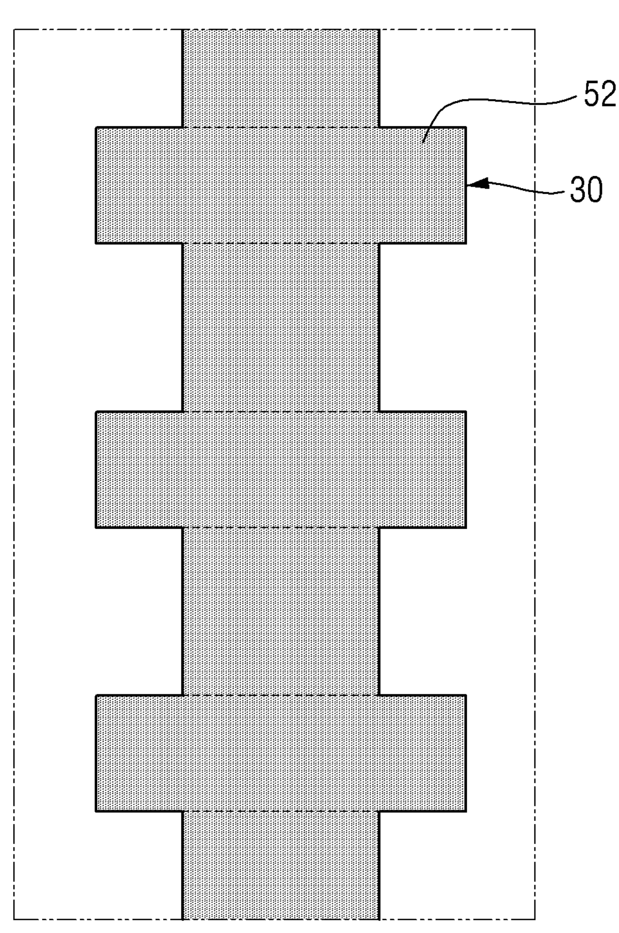
FIG. 4 is a rear view schematically showing light-emitting elements and a first organic insulating layer of a display device according to an embodiment.
Figure 4:
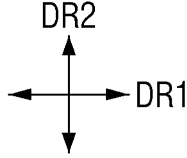
Figure 5:
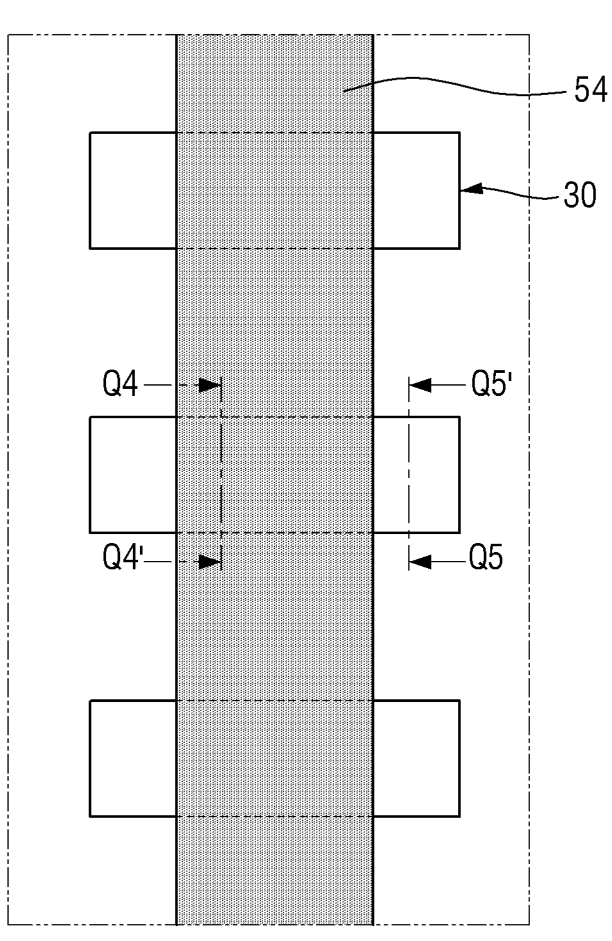
FIG. 5 is a plan view schematically showing light-emitting elements and a second organic insulating layer of the display device according to an embodiment.
Figure 5:
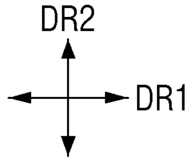
Figure 6:
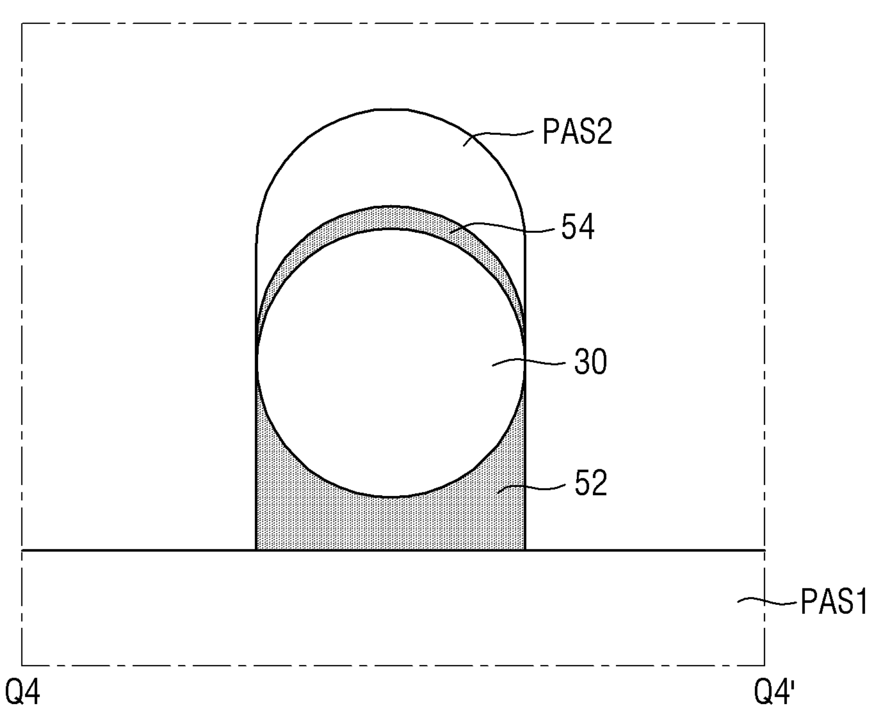
FIG. 6 is a cross-sectional view schematically showing an example, taken along line Q4-Q4' of FIG. 5.
Figure 7:
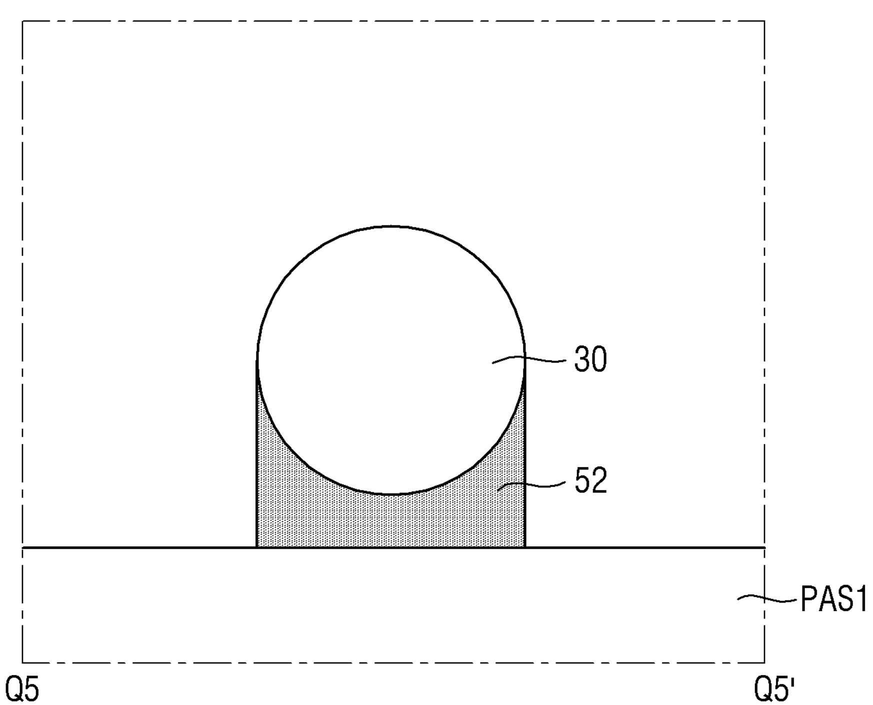
FIG. 7 is a cross-sectional view schematically showing an example, taken along line Q5-Q5' of FIG. 5.
Figure 8:
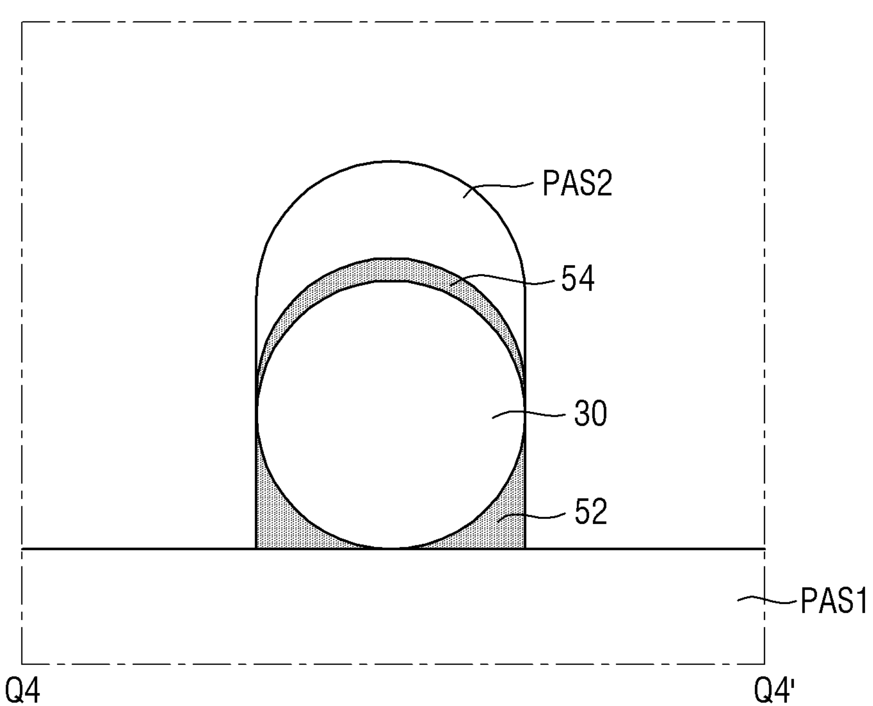
FIG. 8 is a cross-sectional view schematically showing another example, taken along line Q4-Q4' of FIG. 5.
Figure 9:
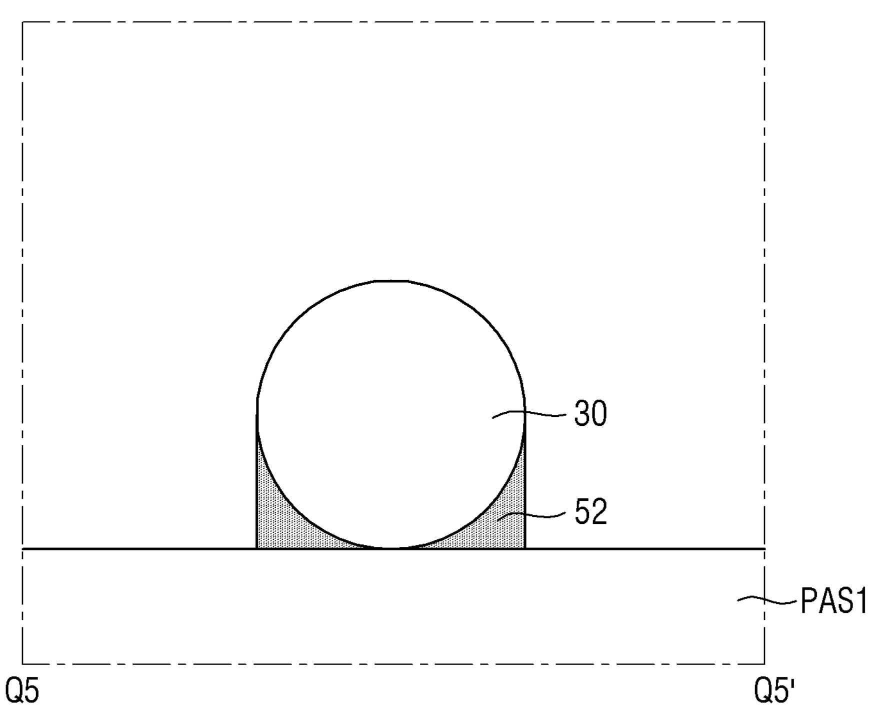
FIG. 9 is a cross-sectional view schematically showing another example, taken along line Q5-Q5' of FIG. 5.

FIG. 4 is a rear view schematically showing light-emitting elements and a first organic insulating layer of a display device according to an embodiment. FIG. 5 is a plan view schematically showing light-emitting elements and a second organic insulating layer of the display device according to an embodiment. FIG. 6 is a cross-sectional view schematically showing an example, taken along line Q4-Q4' of FIG. 5. FIG. 7 is a cross-sectional view schematically showing an example, taken along line Q5-Q5' of FIG. 5. FIG. 8 is a cross-sectional view schematically showing another example, taken along line Q4-Q4' of FIG. 5. FIG. 9 is a cross-sectional view schematically showing another example, taken along line Q5-Q5' of FIG. 5.

Referring to FIGS. 3 through 5, the display device 10 according to an embodiment may include a first organic insulating layer 52 disposed between a first passivation layer PAS1 and the light-emitting elements 30, and a second organic insulating layer 54 disposed on the light-emitting elements 30.

The first organic insulating layer 52 may be disposed between the light-emitting elements 30 and the first passivation layer PAS1. The first organic insulating layer 52 may include protrusions extended in the first direction DR1, and the first organic insulating layer 52 may be extended continuously in the second direction DR2. The first organic insulating layer 52 may be aligned in parallel with the first electrode 21 or the second electrode 22. The first organic insulating layer 52 may have protrusions in the first direction DR1. The extending direction of the light-emitting elements 30 may be substantially identical to the direction of the protrusions of the first organic insulating layer 52. It is, however, to be understood that the disclosure is not limited thereto. The arrangement of the first organic insulating layer 52 may vary depending on the arrangement of the light-emitting elements 30.

The first organic insulating layer 52 may be disposed to overlap the light-emitting elements 30 in the emission area EMA of each sub-pixel PXn. The length of the first organic insulating layer 52 extended in the first direction DR1 may be substantially identical to the length of the light-emitting elements 30. An end of the first organic insulating layer 52 may be disposed on the first electrode 21, and another end of the first organic insulating layer 52 may be disposed on the second electrode 22.

The first organic insulating layer 52 may be in contact (e.g., direct contact) with the first passivation layer PAS1 and the light-emitting elements 30. For example, the lower surface of the first organic insulating layer 52 may be in contact with the upper surface of the first passivation layer PAS1. The upper surface of the first organic insulating layer 52 may be in contact with the lower surface of each of the light-emitting elements 30, and, for example, may be in contact with the insulating film 38 (see FIG. 10) of each of the light-emitting elements 30. The first organic insulating layer 52 may be disposed to overlap the light-emitting elements 30 in the second direction DR2. The first organic insulating layer 52 may be in contact (e.g., direct contact) with the first passivation layer PAS1 and the light-emitting elements 30 and may adhere and fix the light-emitting elements 30 on the first passivation layer PAS1. In this manner, it may be possible to prevent the light-emitting elements 30 from being detached during the cleaning process performed after the process of aligning the light-emitting elements 30.

As shown in FIG. 4, the size of the first organic insulating layer 52 may be larger than the size of the light-emitting elements 30. Specifically, the size of the first organic insulating layer 52 may be larger than the size of the light-emitting elements 30 when viewed from the top. The light-emitting elements 30 may completely overlap the first organic insulating layer 52. In such case, one side of the first organic insulating layer 52 in the first direction DR1 may be aligned with one side of each of the adjacent light-emitting elements 30, and the opposite side of the first organic insulating layer 52 in the first direction DR1 may be aligned with the opposite side of each of the adjacent light-emitting elements 30.

The first organic insulating layer 52 may be made of a polymer resin. The polymer resins may include, for example, at least one selected from the group of acrylic-based, epoxy-based, phenol-based, polyamide, polyimide, unsaturated polyester, polyphenylene, polyphenylene sulfide, benzocyclobutene, cardo, siloxane, silsesquioxane, polymethyl methacrylate, and polycarbonate.

On the other hand, the second organic insulating layer 54 may be disposed on the light-emitting elements 30 and may be disposed between the light-emitting elements 30 and the second passivation layer PAS2. The second organic insulating layer 54 may be partially disposed on and in contact (e.g., direct contact) with the light-emitting elements 30. For example, the second organic insulating layer 54 may have a width smaller than the length of the light-emitting elements 30 and may be disposed on the light-emitting elements 30 while surrounding the light-emitting elements 30 so that both ends thereof may be exposed.

The second organic insulating layer 54 may have a shape extended in the second direction DR2. The direction in which the electrodes 21 and 22 may be extended may be substantially identical to the direction in which the second organic insulating layer 54 may be extended. The second organic insulating layer 54 may be extended in the second direction DR2 on the first passivation layer PAS1 when viewed from the top, thereby forming a linear or island-like pattern in each of the sub-pixels PXn.

The second organic insulating layer 54 may be disposed to overlap the light-emitting elements 30 in the emission area EMA of each sub-pixel PXn. The second organic insulating layer 54 may continuously cover the light-emitting elements 30 in the second direction DR2. The second organic insulating layer 54 can protect the light-emitting elements 30 and fix the light-emitting elements 30 during the process of fabricating the display device 10.

The second organic insulating layer 54 may overlap and may be in contact with the second passivation layer PAS2. For example, the upper surface of the second organic insulating layer 54 may be in contact with the lower surface of the second passivation layer PAS2. The size of the second organic insulating layer 54 may be equal to the size of the second passivation layer PAS2. Specifically, the size of the second organic insulating layer 54 may be equal to the size of the second passivation layer PAS2 when viewed from the top. In such case, the second organic insulating layer 54 may completely overlap the second passivation layer PAS2. For example, a side of the second organic insulating layer 54 may be aligned with a side of the adjacent second passivation layer PAS2, and an opposite side of the second organic insulating layer 54 may be aligned with an opposite side of the adjacent second passivation layer PAS2.

The width of the first organic insulating layer 52 described above may be larger than the width of the second organic insulating layer 54. Specifically, the width W1 of the first organic insulating layer 52 in the direction in which the light-emitting elements 30 may be extended, e.g., in the first direction DR1 may be larger than the width W2 of the second organic insulating layer 54. The second organic insulating layer 54 may be made of a polymer resin and may be made of the same material as the first organic insulating layer 52 described above. The first organic insulating layer 52 and the second organic insulating layer 54 may be formed of the polymer resins of the ink including light-emitting elements simultaneously, and thus may be made of the same material.

Referring to FIGS. 6 and 7, each of the light-emitting elements 30 may be spaced apart from the first passivation layer PAS1 with the first organic insulating layer 52 therebetween. For example, the light-emitting elements 30 may be spaced apart from the first passivation layer PAS1. While the ink is printed, the polymer resins surrounding the light-emitting elements 30 may be dripped, and the polymer resins may be coated under the light-emitting elements 30, so that the first organic insulating layer 52 may be formed. Therefore, the light-emitting elements 30 may be spaced apart from the first passivation layer PAS.

The first organic insulating layer 52 may surround each of the light-emitting elements 30 along the lower curved surface and may be disposed on the first passivation layer PAS1. Accordingly, the first organic insulating layer 52 can adhere and fix the light-emitting elements 30 to the first passivation layer PAS1. The second organic insulating layer 54 may be disposed on the upper central portion of each of the light-emitting elements 30, but may not be disposed on one end of each of the light-emitting elements 30. This is to allow the contact electrode to be easily in contact with the end of each of the light-emitting elements 30 during a subsequent process to be described later.

Referring to FIGS. 8 and 9, according to another embodiment, at least a portion of each of the light-emitting elements 30 may be in contact (e.g., direct contact) with the first passivation layer PAS1. As described above, while the ink is printed, the polymer resins surrounding the light-emitting elements 30 may be dripped, and the polymer resins may spread out in a horizontal direction by the weight of the light-emitting elements 30 and may be in contact with the first passivation layer PAS1. Each of the light-emitting elements 30 may have a circular cross section. A part thereof may be in contact with the first passivation layer PAS1 while another part thereof may be spaced apart from the first passivation layer PAS1 to be in contact with the first organic insulating layer 52.

Referring back to FIG. 3, the first contact electrode CNE1 may be in contact with the first end of each of the light-emitting elements 30, and the second contact electrode CNE2 may be in contact with the second end of each of the light-emitting elements 30. Specifically, the first contact electrode CNE1 may be disposed on the first passivation layer PAS1 and may be in contact with an end of the first organic insulating layer 52, the first end of each of the light-emitting elements 30, an end of the second organic insulating layer 54 and an end of the second passivation layer PAS2. The second contact electrode CNE2 may be disposed on the first passivation layer PAS1 and may be in contact with another end of the first organic insulating layer 52, the second end of each of the light-emitting elements 30, another end of the second organic insulating layer 54 and another end of the second passivation layer PAS2.

The first contact electrode CNE1 and the second contact electrode CNE2 may be in contact with the respective ends of the second passivation layer PAS2, but may not be in contact with the upper surface of the second passivation layer PAS2. For example, the first contact electrode CNE1 and the second contact electrode CNE2 may not be disposed on the upper surface of the second passivation layer PAS2 and may not overlap the second passivation layer PAS2. During a subsequent process described below, the contact electrode material layer formed on the second passivation layer PAS2 may be etched out, and thus the first contact electrode CNE1 and the second contact electrode CNE2 may not be in contact with the upper surface of the second passivation layer PAS2.

Figure 10:
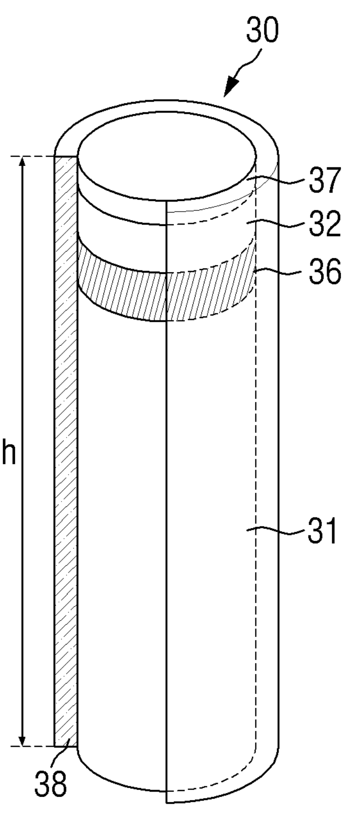
FIG. 10 is a view schematically showing a light-emitting element according to an embodiment of the disclosure.

FIG. 10 is a view schematically showing a light-emitting element according to an embodiment of the disclosure.

The light-emitting element 30 may be a light-emitting diode. Specifically, the light-emitting element 30 may have a size in micrometers or nanometers and may be an inorganic light-emitting diode made of an inorganic material. Inorganic light-emitting diodes may be aligned between two electrodes facing each other as polarities may be created by forming an electric field in a particular direction between the two electrodes. The light-emitting elements 30 may be aligned between two electrodes by an electric field formed over the two electrodes.

The light-emitting element 30 according to an embodiment may have a shape extended in one direction. The light-emitting element 30 may have a shape of a cylinder, a rod, a wire, a tube, etc. It is to be understood that the shape of the light-emitting element 30 is not limited thereto. The light-emitting element 30 may have a variety of shapes including a polygonal column shape such as a cube, a cuboid and a hexagonal column, or a shape that may be extended in a direction with partially inclined outer surfaces. The semiconductors included in the light-emitting element 30 to be described later may have a structure sequentially arranged or stacked on each other along the one direction.

The light-emitting element 30 may include a semiconductor layer doped with impurities of a conductive type (e.g., p-type or n-type). The semiconductor layers may emit light of a certain wavelength band by transmitting an electric signal applied from an external power source.

As shown in FIG. 10, the light-emitting element 30 may include a first semiconductor layer 31, a second semiconductor layer 32, an emissive layer 36, an electrode layer 37 and an insulating film 38.

The first semiconductor layer 31 may be an n-type semiconductor. In case that the light-emitting element 30 emits light of a blue wavelength band, the first semiconductor layer 31 may include a semiconductor material having the following chemical formula: $Al_xGa_yIn_{1-x-y}N$ ($0 \le x \le 1$, $0 \le y \le 1$, $0 \le x+y \le 1$). For example, it may be at least one of n-type doped AlGaInN, GaN, AlGaN, InGaN, AlN and InN. The first semiconductor layer 31 may be doped with an n-type dopant, and the n-type dopant may be Si, Ge, Sn, etc. For example, the first semiconductor layer 31 may be n-GaN doped with n-type Si. The length of the first semiconductor layer 31 may range, but is not limited to, from about 1.5 μm to about 5 μm.

The second semiconductor layer 32 may be disposed on the emissive layer 36 to be described later. The second semiconductor layer 32 may be a p-type semiconductor. In case that the light-emitting element 30 emits light of a blue or green wavelength band, the second semiconductor layer 32 may include a semiconductor material having the following chemical formula: $Al_xGa_yIn_{1-x-y}N$ ($0 \le x \le 1$, $0 \le y \le 1$, $0 \le x+y \le 1$). For example, it may be at least one of p-type doped AlGaInN, GaN, AlGaN, InGaN, AlN and InN. The second semiconductor layer 32 may be doped with a p-type dopant, and the p-type dopant may be Mg, Zn, Ca, Se, Ba, etc. For example, the second semiconductor layer 32 may be p-GaN doped with p-type Mg. The length of the second semiconductor layer 32 may range, but is not limited to, from about 0.05 μm to about 0.10 μm.

Although each of the first semiconductor layer 31 and the second semiconductor layer 32 may be embodied as a signal layer in the drawings, the disclosure is not limited thereto. Depending on the material of the emissive layer 36, the first semiconductor layer 31 and the second semiconductor layer 32 may further include a larger number of layers, e.g., a clad layer or a tensile strain barrier reducing (TSBR) layer.

The emissive layer 36 may be disposed between the first semiconductor layer 31 and the second semiconductor layer 32. The emissive layer 36 may include a material having a single or multiple quantum well structure. In case that the emissive layer 36 includes a material having the multiple quantum well structure, the structure may include quantum layers and well layers alternately stacked on one another. The emissive layer 36 may emit light as electron-hole pairs may be combined therein in response to an electrical signal applied through the first semiconductor layer 31 and the second semiconductor layer 32. In case that the emissive layer 36 emits light of the blue wavelength band, it may include a material such as AlGaN and AlGaInN. In particular, in case that the emissive layer 36 has a multi-quantum well structure in which quantum layers and well layers may be alternately stacked on one another, the quantum layers may include AlGaN or AlGaInN, and the well layers may include a material such as GaN and AlGaN. For example, the emissive layer 36 may include AlGaInN as the quantum layer and AlInN as the well layer, and, as described above, the emissive layer 36 may emit blue light having a center wavelength band of about 450 nm to about 495 nm.

It is, however, to be understood that the disclosure is not limited thereto. The emissive layer 36 may have a structure in which a semiconductor material having a large band gap energy and a semiconductor material having a small band gap energy may be alternately stacked on one another, and may include other Group III to Group V semiconductor materials depending on the wavelength range of the emitted light. Accordingly, the light emitted from the emissive layer 36 is not limited to the light of the blue wavelength band. The emissive layer 36 may emit light of red or green wavelength band in some embodiments. The length of the emissive layer 36 may be, but is not limited to, in the range of about 0.05 μm to about 0.10 μm.

The light emitted from the emissive layer 36 may exit not only through the outer surfaces of the light-emitting element 30 in the longitudinal direction but also through the side surfaces. The direction in which the light emitted from the emissive layer 36 propagates is not limited to one direction.

The electrode layer 37 may be an ohmic contact electrode. It is, however, to be understood that the disclosure is not limited thereto. The electrode layer 37 may be a Schottky contact electrode. The light-emitting element 30 may include at least one electrode layer 37. Although the light-emitting element 30 includes one electrode layer 37 in the example shown in FIG. 4, the disclosure is not limited thereto. In some implementations, the light-emitting element 30 may include a larger number of electrode layers 37 or the electrode layer may be omitted. The following description of the light-emitting element 30 may be equally applied even if the number of electrode layers 37 may be different or it further includes other structures.

The electrode layer 37 can reduce the resistance between the light-emitting element 30 and the electrodes or the contact electrodes in case that the light-emitting element 30 may be electrically connected to the electrodes or the contact electrodes in the display device 10 according to an embodiment of the disclosure. The electrode layer 37 may include a metal having conductivity. For example, the electrode layer 37 may include at least one of aluminum (Al), titanium (Ti), indium (In), gold (Au), silver (Ag), indium tin oxide (ITO), indium zinc oxide (IZO) and indium tin-zinc oxide (ITZO). The electrode layer 37 may include a semiconductor material doped with n-type or p-type impurities. The electrode layer 37 may include the same material or may include different materials. It is, however, to be understood that the disclosure is not limited thereto.

The insulating film 38 may be disposed to surround outer surfaces of the semiconductor layers and electrode layers described above. For example, the insulating film 38 may be disposed to surround at least the outer surface of the emissive layer 36, and may be extended in a direction in which the light-emitting element 30 may be extended. The insulating film 38 may serve to protect the above-described elements. The insulating film 38 may be formed to surround the side surfaces of the elements, and both ends of the light-emitting element 30 in the longitudinal direction may be exposed.

Although the insulating film 38 may be extended in the longitudinal direction of the light-emitting element 30 to cover from the first semiconductor layer 31 to the side surface of the electrode layer 37 in the example shown in the drawing, the disclosure is not limited thereto. The insulating film 38 may cover only the outer surface of a portion of the semiconductor layer, including the light-emitting layer 36, or may cover only a part a portion of the outer surface of the electrode layer 37 to partially expose the outer surface of the electrode layer 37. A portion of the upper surface of the insulating film 38 may be rounded which may be adjacent to at least one end of the light-emitting element 30 in cross section.

The thickness of the insulating film 38 may be, but is not limited to, in the range of about 10 nm to about 1.0 μm. In an embodiment, the thickness of the insulating film 38 may be approximately 40 nm.

The insulating film 38 may include materials having an insulating property such as silicon oxide (SiOx), silicon nitride (SiNx), silicon oxynitride (SiOxNy), aluminum nitride (AlN) and aluminum oxide ($Al_2O_3$). Accordingly, it may be possible to prevent an electrical short-circuit that may occur in case that the emissive layer 36 comes in contact with an electrode through which an electric signal may be transmitted to the light-emitting element 30. Since the insulating film 38 may include the emissive layer 36 to protect the outer surface of the light-emitting element 30, it may be possible to prevent a decrease in luminous efficiency.

The outer surface of the insulating film 38 may be subjected to surface treatment. The light-emitting elements 30 may be dispersed in an ink, and droplets of the ink may be ejected onto an electrode. In doing so, a surface treatment may be applied to the insulating film 38 so that it becomes hydrophobic or hydrophilic in order to keep the light-emitting elements 30 dispersed in the ink from being aggregated with one another. For example, the outer surface of the insulating film 38 may be subjected to surface treatment with a material such as stearic acid and 2,3-naphthalene dicarboxylic acid.

The length h of the light-emitting element 30 may range from about 1 μm to about 10 μm or from about 2 μm to about 6 μm, and in an embodiment, approximately 3 μm to approximately 5 μm. The diameter of the light-emitting elements 30 may range from about 30 nm to about 700 nm, and the aspect ratio of the light-emitting elements 30 may range from about 1.2 to about 100. It is, however, to be understood that the disclosure is not limited thereto. The light-emitting elements 30 included in the display device 10 may have different diameters depending on compositional difference of the emissive layer 36. In an embodiment, the diameter of the light-emitting elements 30 may be approximately 500 nm.

It is to be noted that the shape and material of the light-emitting element 30 are not limited to those described with reference to FIG. 10. In some embodiments, the light-emitting elements 30 may include a greater number of layers or may have different shapes.

Figure 11:
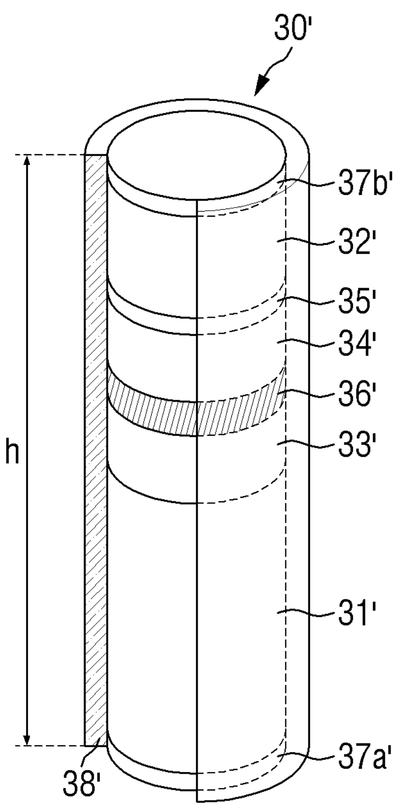
FIG. 11 is a view schematically showing a light-emitting element according to another embodiment of the disclosure.

FIG. 11 is a view schematically showing a light-emitting element according to another embodiment of the disclosure.

Referring to FIG. 11, a light-emitting element 30' according to another embodiment may further include a third semiconductor layer 33' disposed between a first semiconductor layer 31' and an emissive layer 36', and a fourth semiconductor layer 34' and a fifth semiconductor layer 35' disposed between the emissive layer 36' and the second semiconductor layer 32'. The light-emitting element 30' of FIG. 11 may be different from the light-emitting element of FIG. 10 in that semiconductor layers 33', 34' and 35' and electrode layers **37*a*' and 37*b*' may be further disposed, and that an emissive layer 36'** may include different elements. In the following description, descriptions will focus on the differences, and redundant description will be omitted.

The emissive layer 36 of the light-emitting element 30 of FIG. 10 may include nitrogen (N) and thus may emit blue or green light. On the other hand, in the light-emitting element 30' of FIG. 11, the emissive layer 36' and other semiconductor layers each may be a semiconductor including at least phosphorus (P). The light-emitting element 30' according to an embodiment of the disclosure may emit red light having a center wavelength band of about 620 nm to about 750 nm. It is, however, to be understood that the center wavelength band of red light is not limited to the above numerical values and may encompass all wavelength ranges that can be recognized as red in the art.

Specifically, the first semiconductor layer 31' may include, as an n-type semiconductor layer, a semiconductor material having the following chemical formula: $In_xAl_yGa_{1-x-y}P$ ($0 \leq x \leq 1$, $0 \leq y \leq 1$, $0 \leq x+y \leq 1$). The first semiconductor layer 31' may be one or more of n-type InAlGaP, GaP, AlGaP, InGaP, AlP and InP. For example, the first semiconductor layer 31' may be n-AlGaInP doped with n-type Si.

Specifically, the second semiconductor layer 32' may include, as a p-type semiconductor layer, a semiconductor material having the following chemical formula: $In_xAl_yGa_{1-x-y}P$ ($0 \leq x \leq 1$, $0 \leq y \leq 1$, $0 \leq x+y \leq 1$). The second semiconductor layer 32' may be one or more of p-type InAlGaP, GaP, AlGaNP, InGaP, AlP and InP. For example, the second semiconductor layer 32' may be p-GaP doped with p-type Mg.

The emissive layer 36' may be disposed between the first semiconductor layer 31' and the second semiconductor layer 32'. The emissive layer 36' may include a material having a single or multiple quantum well structure and may emit light of a certain wavelength band. In case that the emissive layer 36' has a multi-quantum well structure in which quantum layers and well layers are alternately stacked on one another, the quantum layers may include AlGaP or AlInGaP, and the well layers may include GaP or AlInP. For example, the emissive layer 36' may include AlGaInP as the quantum layers and AlInP as the well layers and may emit red light having a central wavelength band of about 620 nm to about 750 nm.

The light-emitting element 30' of FIG. 11 may include a clad layer disposed adjacent to the emissive layer 36'. As shown in FIG. 11, the third semiconductor layer 33' and the fourth semiconductor layer 34' disposed under and on the emissive layer 36' between the first semiconductor layer 31' and the second semiconductor layer 32' may be clad layers.

The third semiconductor layer 33' may be disposed between the first semiconductor layer 31' and the emissive layer 36'. The third semiconductor layer 33' may be an n-type semiconductor like the first semiconductor layer 31', and may include a semiconductor material having the following chemical formula: $In_xAl_yGa_{1-x-y}P$ ($0 \le x \le 1$, $0 \le y \le 1$, $0 \le x+y \le 1$). For example, the first semiconductor layer 31' may be n-AlGaInP, and the third semiconductor layer 33' may be n-AlInP. It is, however, to be understood that the disclosure is not limited thereto.

The fourth semiconductor layer 34' may be disposed between the emissive layer 36' and the second semiconductor layer 32'. The fourth semiconductor layer 34' may be an n-type semiconductor like the second semiconductor layer 32', and may include a semiconductor material having the following chemical formula: $In_xAl_yGa_{1-x-y}P$ ($0 \le x \le 2$, $0 \le y \le 1$, $0 \le x+y \le 1$). For example, the second semiconductor layer 32' may be p-GaP, and the fourth semiconductor layer 34' may be p-AlInP.

The fifth semiconductor layer 35' may be disposed between the fourth semiconductor layer 34' and the second semiconductor layer 32'. The fifth semiconductor layer 35' may be a p-type doped semiconductor, like the second semiconductor layer 32' and the fourth semiconductor layer 34'. In some embodiments, the fifth semiconductor layer 35' may reduce a difference in lattice constant between the fourth semiconductor layer 34' and the second semiconductor layer 32'. The fifth semiconductor layer 35' may be a tensile strain barrier reducing (TSBR) layer. For example, the fifth semiconductor layer 35' may include, but is not limited to, p-GaInP, p-AlInP, p-AlGaInP, etc. The length of the third semiconductor layer 33', the fourth semiconductor layer 34' and the fifth semiconductor layer 35' may be, but are not limited to, a range of about 0.08 μmm to about 0.25 μm.

The first electrode layer **37*a*' and the second electrode layer 37*b*' may be disposed on the first semiconductor layer 31' and the second semiconductor layer 32', respectively. The first electrode layer 37*a*' may be disposed on the lower surface of the first semiconductor layer 31', and the second electrode layer 37*b*' may be disposed on the upper surface of the second semiconductor layer 32'. It is, however, to be understood that the disclosure is not limited thereto. At least one of the first electrode layer 37*a*' and the second electrode layer 37*b*' may be eliminated. For example, in the light-emitting element 30', the first electrode layer 37*a*' may not be disposed on the lower surface of the first semiconductor layer 31', and the second electrode layer 37*b*' may be disposed on the upper surface of the second semiconductor layer 32'**.

The above-described light-emitting elements 30 may be ejected onto the electrodes 21 and 22 via an inkjet printing process. The light-emitting elements 30 dispersed in a solvent may be ejected onto the electrodes 21 and 22, and an alignment signal may be applied to the electrodes 21 and 22, so that the light-emitting elements can be disposed between the electrodes 21 and 22. In case that an alignment signal is applied to the electrodes 21 and 22, an electric field may be formed over them, and the light-emitting elements 30 may receive a dielectrophoretic force by the electric field. In case that the light-emitting elements 30 receive the dielectrophoretic force, they may be disposed between the first electrode 21 and the second electrode 22 with their orientations and locations changed.

According to an embodiment of the disclosure, the ink including the light-emitting elements 30 may include the polymer resins, and the first organic insulating layer 52 and the second organic insulating layer 54 can be formed under and on the aligned light-emitting elements 30, respectively. In this manner, it may be possible to prevent the light-emitting elements 30 from being detached during the cleaning process performed after the light-emitting elements 30 have been aligned.

Hereinafter, the ink including the light-emitting elements 30 will be described.

Figure 12:
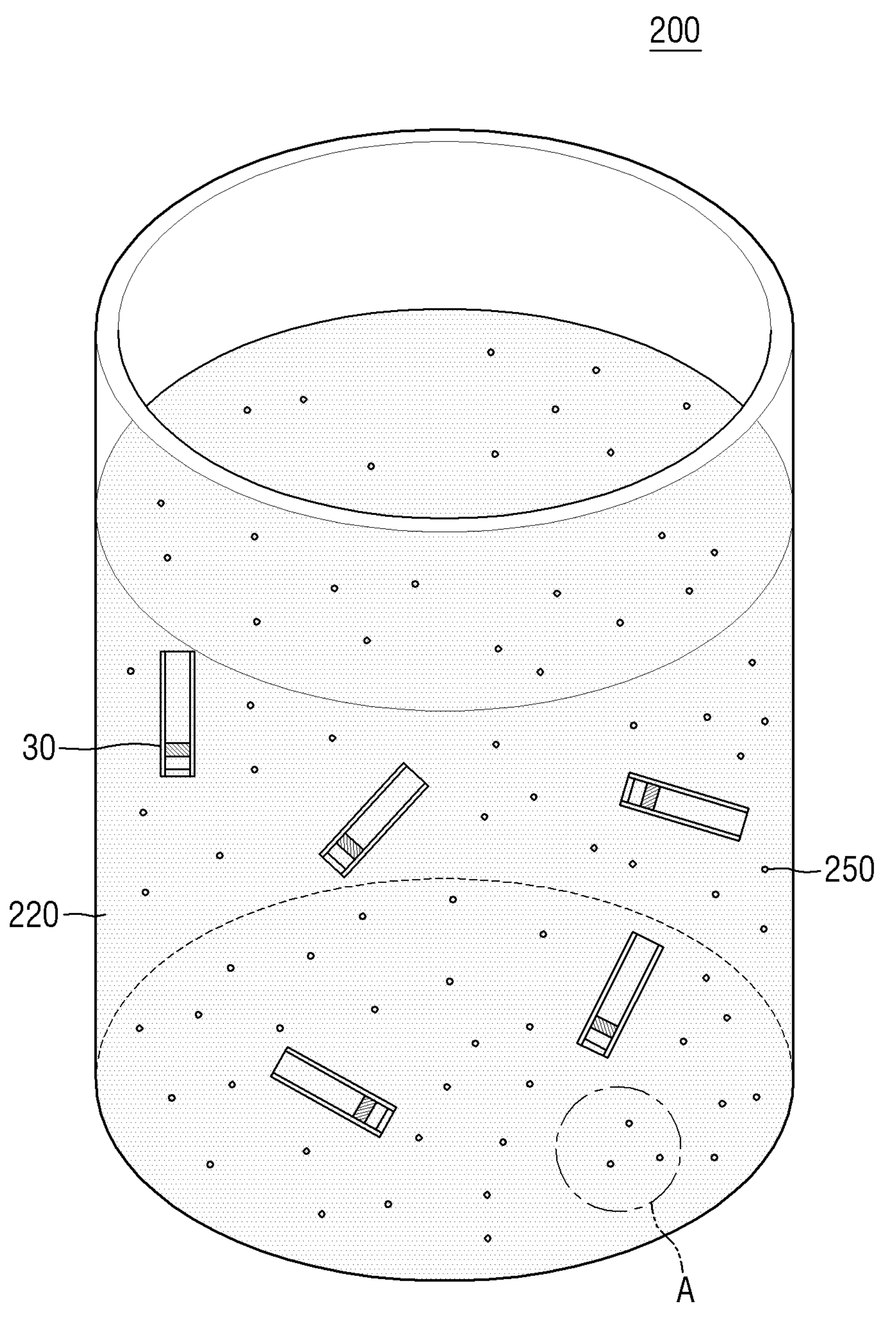
FIG. 12 is a view schematically showing an ink including light-emitting elements according to an embodiment of the disclosure.

FIG. 12 is a view schematically showing an ink including light-emitting elements according to an embodiment of the disclosure.

Referring to FIG. 12, an ink 200 according to an embodiment of the disclosure may include a solvent 220, and light-emitting elements 30 and polymer resins 250 dispersed in the solvent 220. The light-emitting elements 30 may be either the light-emitting element 30 or the light-emitting element 30' described above with reference to FIGS. 10 and 11. The light-emitting element 30 of FIG. 10 is shown in FIG. 12. The light-emitting elements 30 have already been described above, and thus the solvent 220 and the polymer resins 250 will be described in detail below.

The solvent 220 may store the light-emitting elements 30 each including semiconductor layers as they may be dispersed therein, and may be an organic solvent that does not react with the light-emitting elements 30. The solvent 220 may have such a viscosity that it can be discharged in a liquid state through a nozzle of an inkjet printing apparatus. The molecules of the solvent 220 may surround the surfaces of the light-emitting elements 30 and disperse the light-emitting elements 30. The ink 200 including the light-emitting elements 30 may be prepared in a solution or colloid.

According to an embodiment of the disclosure, the solvent 220 may be, but is not limited to, acetone, water, alcohol, toluene, propylene glycol (PG) or propylene glycol methyl acetate (PGMA), triethylene glycol monobutyl ether (TGPE), diethylene glycol monophenyl ether (DGPE), amide solvent, dicarbonyl solvent, diethylene glycol dibenzoate, tricarbonyl solvent, triethyl citrate, phthalate solvent, benzyl butyl phthalate, bis(2-ethlyhexyl)phthalate, bis(2-ethylhexyl)isophthalate, ethyl phthalyl ethyl glycolate, or a combination thereof.

The polymer resins 250 may be dispersed in the solvent 220 together with the light-emitting elements 30. A content of the polymer resins 250 may be included in the ink 200. After the light-emitting elements 30 have been aligned, the polymer resins 250 may be formed as the first organic insulating layer 52 and the second organic insulating layer 54.

According to an embodiment of the disclosure, the polymer resins 250 included in the ink 200 may include at least one selected from the group of acrylic-based, epoxy-based, phenol-based, polyamide, polyimide, unsaturated polyester, polyphenylene, polyphenylene sulfide, benzocyclobutene, cardo, siloxane, silsesquioxane, polymethyl methacrylate, and polycarbonate. By using the ink 200 including the polymer resins 250, the first organic insulating layer 52 and the second organic insulating layer 54 can be formed to adhere and fix the light-emitting elements 30 after they have been aligned, thereby preventing the light-emitting elements 30 from being detached.

The ink 200 may include a constant content of light-emitting elements 30 per weight, and the polymer resins 250 may be included at a constant content relative to the weight of the ink 200.

According to an embodiment of the disclosure, the ink 30 may include the polymer resins 250 from about 1 to about 10 parts by weight based on 100 parts by weight of the ink 200. If the polymer resins 250 are presented in an amount of about 1 part by weight based on 100 parts by weight of the ink 200 or more, the first and second organic insulating layers 52 and 54 formed on and under the light-emitting elements 30 can have an effective thickness. If the polymer resins 250 are presented in an amount of 10 parts by weight or less, it may be possible to prevent that the viscosity of the ink 200 may be too high thereby making ejection of the ink difficult.

The content of the light-emitting elements 30 included in the ink 200 may vary depending on the number of light-emitting elements 30 per droplet of the ink 200 discharged through a nozzle during a printing process. According to an embodiment of the disclosure, the light-emitting elements 30 may be included in the solvent from about 0.01 to about 1 parts by weight based on 100 parts by weight of the ink 200. It is, however, to be noted that this is merely illustrative, and the content of the light-emitting elements 30 may vary depending on the number of light-emitting elements 30 per droplet of the ink 200.

The ink 200 may further include a dispersant (not shown) that improves the degree of dispersion of the light-emitting elements 30. The type of the dispersant is not particularly limited herein. The content of the dispersant may be determined appropriately to further disperse the light-emitting elements 30. For example, the dispersant may be included from about 10 to about 50 parts by weight based on 100 parts by weight of the light-emitting elements 30. It is, however, to be understood that the disclosure is not limited thereto.

In fabricating a display device including the light-emitting elements 30 by using the ink 200 according to an embodiment of the disclosure, a uniform number of light-emitting elements 30 per unit area can be disposed, and the solvent 220 can be completely removed, which may remain as a foreign substance.

During the process of fabricating the display device 10, a process of disposing the light-emitting elements 30 on the electrodes 21 and 22 may be carried out, which may be carried out via the printing process using the ink 200.

Hereinafter, processing steps of fabricating the display device 10 according to an embodiment of the disclosure will be described with reference to other drawings.

Figure 13:
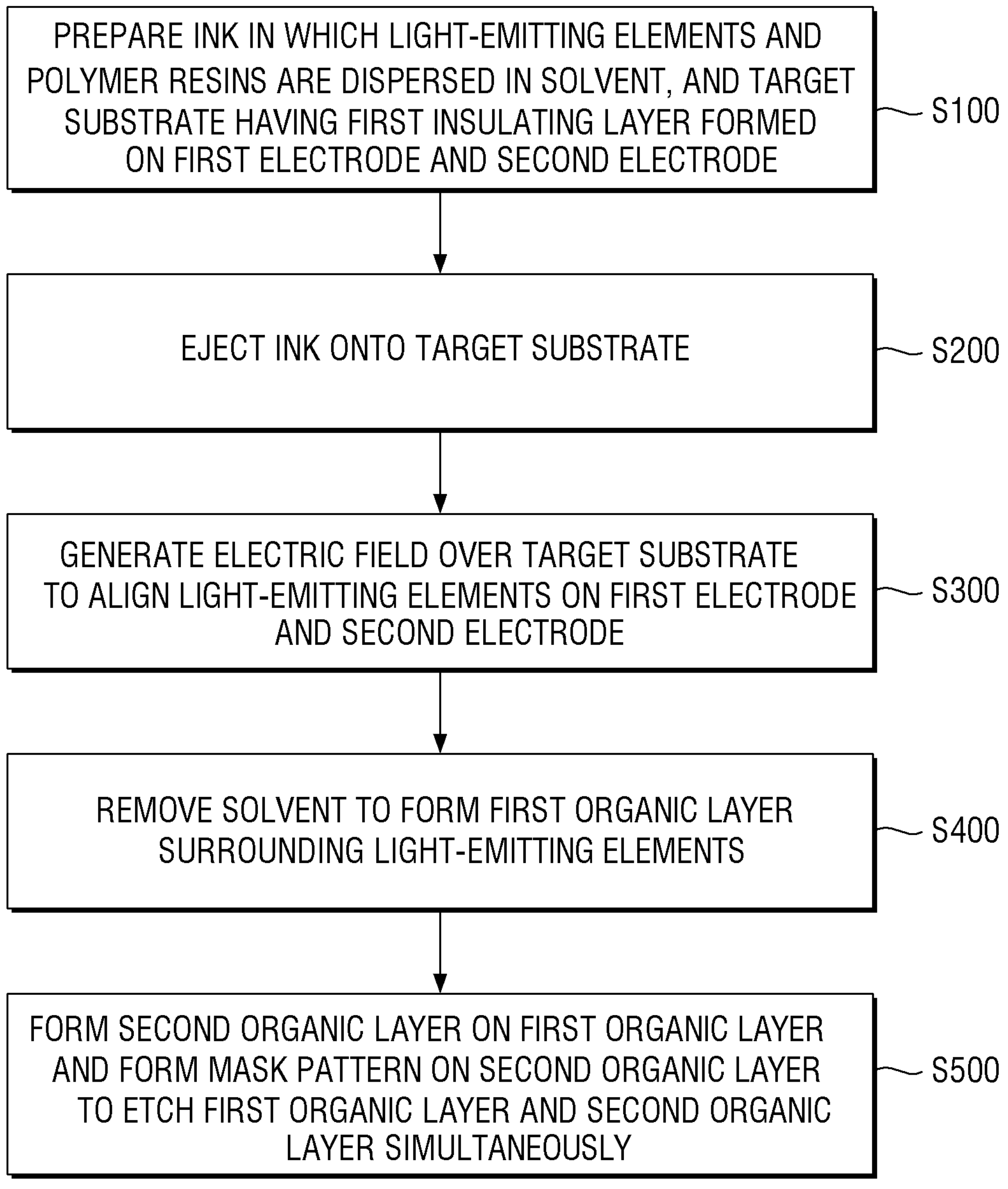
FIG. 13 is a flowchart of a method of fabricating a display device according to an embodiment of the disclosure.

FIG. 13 is a flowchart of a method of fabricating a display device according to an embodiment of the disclosure.

Referring to FIG. 13, a method of fabricating a display device 10 according to an embodiment of the disclosure may include preparing an ink 200 in which light-emitting elements 30 and polymer resins 250 may be dispersed in a solvent 220, and a target substrate SUB having a first passivation layer PAS1 formed on a first electrode 21 and a second electrode 22 (step S100), ejecting the ink 200 onto the target substrate SUB (step S200), generating an electric field over the target substrate to align the light-emitting elements 30 on the first electrode 21 and the second electrode 22 (step S300), removing the solvent 220 and forming a first organic layer 55 (described below) surrounding the light-emitting elements 30 (step S400), and forming a second organic layer 58 (described below) on the first organic layer 55, forming a mask pattern MP on the second organic layer 58, and etching out the first organic layer 55 and the second organic layer 58 simultaneously (step S500).

Hereinafter, a method of fabricating the display device 10 will be described in detail with reference to other drawings in conjunction with FIG. 13.

FIGS. 14 to 25 are cross-sectional views schematically showing some of the processing steps of fabricating a display device according to an embodiment of the disclosure.

Figure 14:
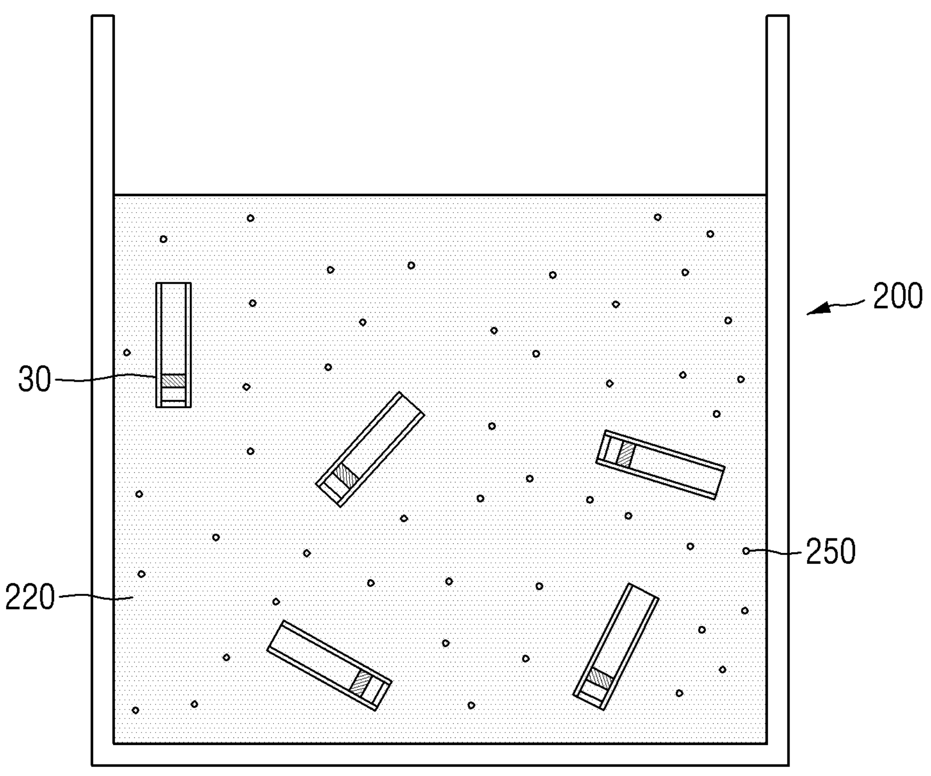
FIGS. 14 to 25 are cross-sectional views schematically showing some of processing steps of fabricating a display device according to an embodiment of the disclosure.
Figure 15:
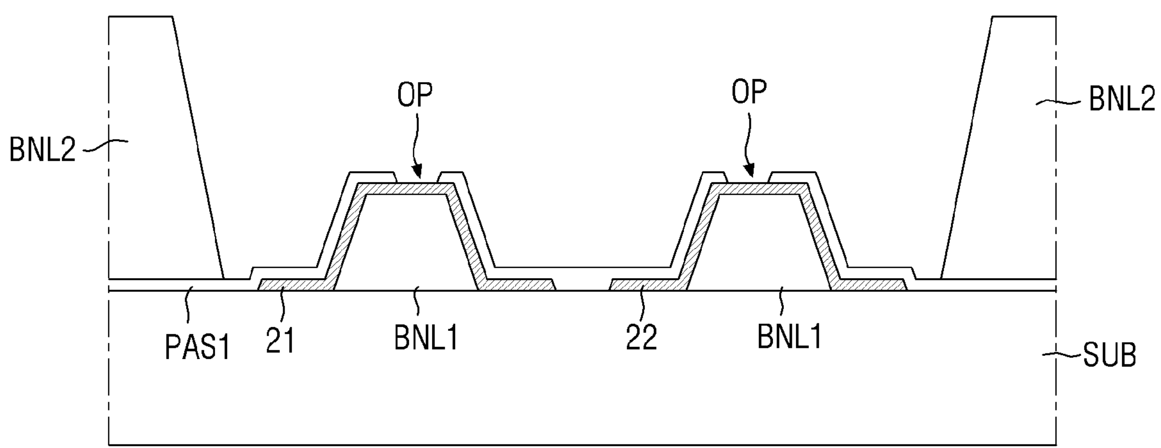

Initially, referring to FIGS. 14 and 15, an ink 200 including light-emitting elements 30, a solvent 220 and polymer resins 250, and a target substrate SUB on which a first electrode 21, a second electrode 22, a first passivation layer PAS1 and first banks BNL1 may be disposed may be prepared. Openings OP may be formed in the first passivation layer PAS1, via which electrode layers 21 and 22 may be exposed, respectively. Although a pair of electrodes may be disposed on the target substrate SUB in the drawing, a larger number of electrode pairs may be disposed on the target substrate SUB. The target substrate SUB may include circuit elements disposed thereon in addition to the first substrate 11 of the display device 10 described above. In the following description, the circuit elements will be omitted for convenience of illustration.

The ink 200 may include the solvent 220, and the light-emitting elements 30 and the polymer resins 250 dispersed in the solvent 220. The polymer resins 250 may be uniformly dispersed in the solvent 220.

The preparing of the ink 200 may include a process of mixing the light-emitting elements 30, the solvent 220, the polymer resins 250, and a dispersant. As another example, the preparing the ink 200 may include a first dispersion process of mixing the light-emitting elements 30, the solvent 220 and the dispersant, and a second dispersion process of adding the polymer resins 250 to the solution produced by the first dispersion process.

The dispersion process may be performed by mixing the light-emitting elements 30, the polymer resins 250 and the dispersant in the solvent 220, and mixing them for about 5 minutes or more. As described above, each of the light-emitting elements 30 may have a diameter of about 1 μm or less, or about 500 nm or less, and a length of about 1 μm to about 10 μm, or approximately 4 μm. The light-emitting elements 30 may be included from about 0.01 to about 1 parts by weight based on 100 parts by weight of the ink 200. The polymer resins 250 may be included from about 1 to about 10 parts by weight based on 100 parts by weight of the 200. The dispersant may be included from about 10 to about 50 parts by weight based on 100 parts by weight of the light-emitting elements 30. The mixing process may be performed by a sonication process, a stirring process, a milling process, etc., or a combination thereof.

The ink 200 produced by the dispersion process may be stored at room temperature (about 25° C.). The polymer resins 250 of the ink 200 may be uniformly dispersed with the solvent 220 and the light-emitting elements 30. The light-emitting elements 30 may hardly precipitate and may remain dispersed.

Figure 16:
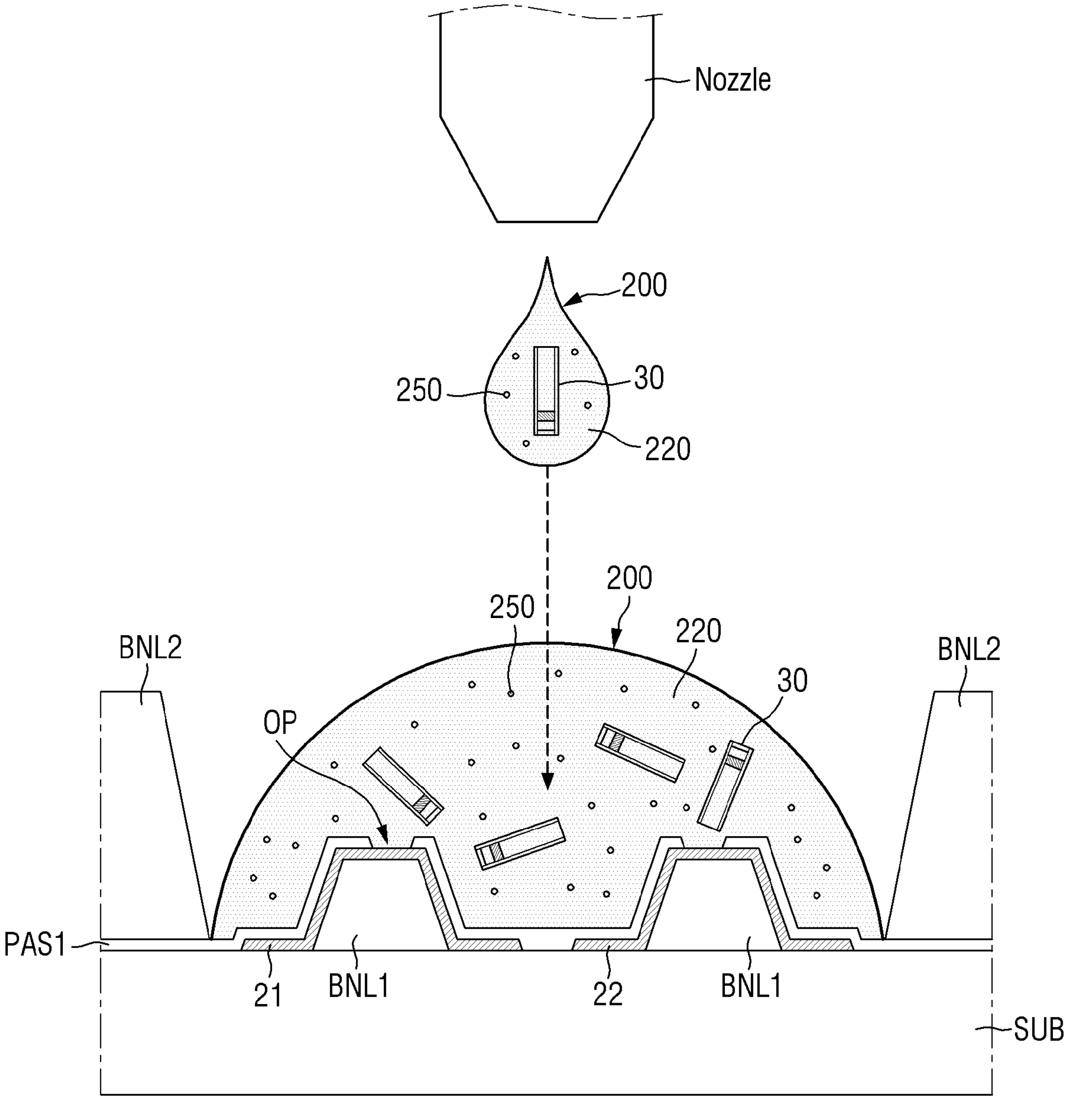

Subsequently, referring to FIG. 16, droplets of the ink 200 may be ejected onto the first passivation layer PAS1 covering the first electrode 21 and the second electrode 22 on the target substrate SUB. According to an embodiment of the disclosure, droplets of the ink 200 may be ejected onto the first passivation layer PAS1 via a printing process using an inkjet printing apparatus. The droplets of the ink 200 may be ejected through a nozzle of an inkjet head included in the inkjet printing apparatus. The ink 200 may flow along an internal path formed in the inkjet head and may be discharged onto the target substrate SUB through the nozzle. The droplets of the ink 200 discharged from the nozzle may seat on the first passivation layer PAS1 on which the electrodes 21 and 22 disposed on the target substrate SUB may be formed. The light-emitting elements 30 may have a shape extending in a direction, and may be dispersed in the ink 200 with the direction randomly oriented.

In case that the droplets of the ink 200 are ejected onto the first passivation layer PAS1, the ink 200 may evenly spread in the second bank BNL2 without overflowing the second bank BNL2. Accordingly, the light-emitting elements 30 and the polymer resins 250 dispersed in the ink 200 may be evenly distributed in the second bank BNL2.

Subsequently, a process of generating an electric field over the target substrate SUB to align the light-emitting elements 30 on the electrodes 21 and 22 (step S300) may be performed.

Figure 17:
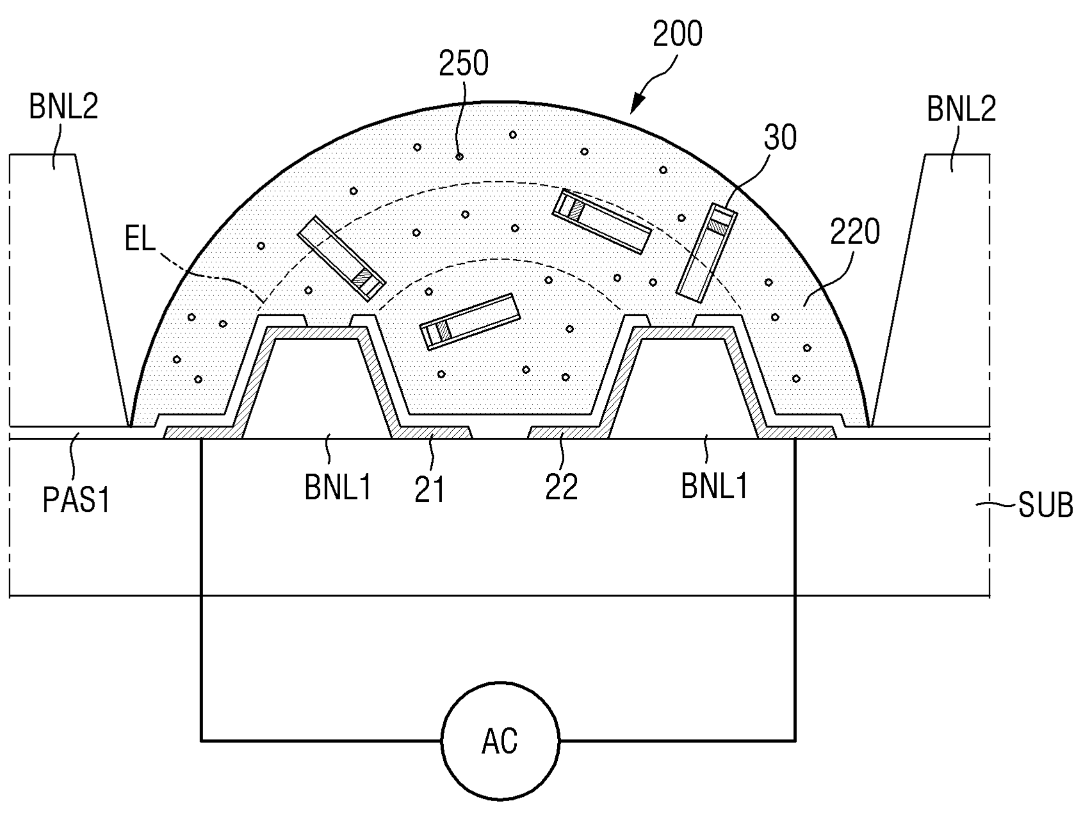

Referring to FIG. 17, after the droplets of the ink 200 including the light-emitting elements 30 may be ejected onto the target substrate SUB, an alignment signal may be applied to the electrodes 21 and 22 to generate an electric field EL over the target substrate SUB. The light-emitting elements 30 dispersed in the solvent 220 may receive a dielectrophoretic force by the electric field EL, and may be disposed on the electrodes 21 and 22 with their orientations and locations changed.

In case that the electric field EL is generated over the target substrate SUB, the light-emitting elements 30 may receive the dielectrophoretic force. In case that the electric field EL generated over the target substrate SUB is parallel to the upper surface of the target substrate, the light-emitting elements 30 may be aligned such that the direction in which they are extended may be parallel to the target substrate, and may be disposed on the first electrode 21 and the second electrode 22. The light-emitting elements 30 may move toward the electrodes 21 and 22 from the initially dispersed locations by the dielectrophoretic force. Both ends of each of the light-emitting elements 30 may be disposed on the first electrode 21 and the second electrode 22, respectively, while their orientations may be changed by the electric field EL. Each of the light-emitting elements 30 may include semiconductor layers doped with different conductivity types, and may have a dipole moment within therein. The light-emitting elements 30 having the dipole moment may receive the dielectrophoretic force so that the ends may be disposed on the electrodes 21 and 22, respectively, in case that they may be placed under the electric field EL.

After the light-emitting elements 30 have been disposed between the electrodes 21 and 22, heat may be applied to the target substrate SUB to remove the solvent 220 so that the first organic layer 55 surrounding the light-emitting elements 30 may be formed (step S400).

Figure 18:
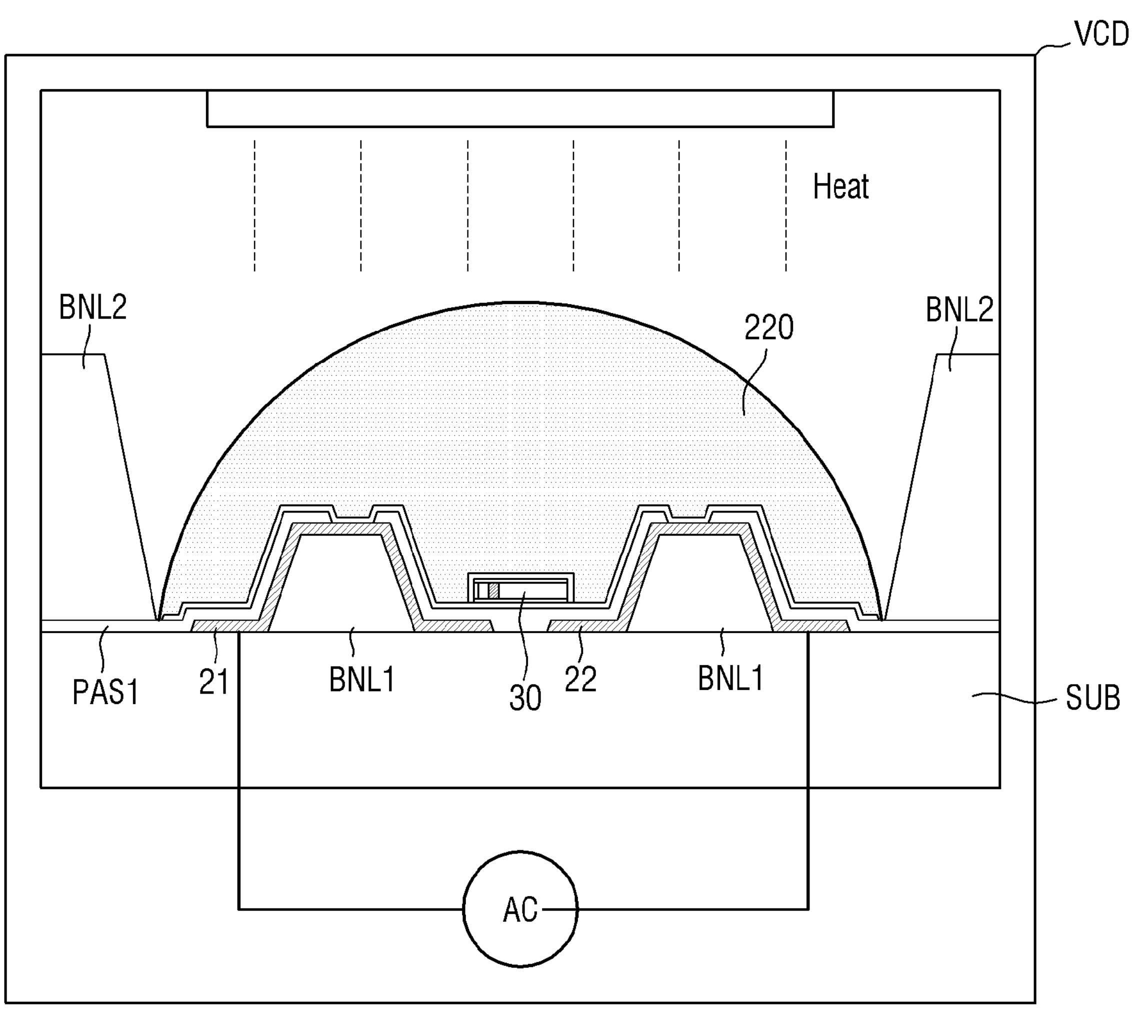
Figure 19:
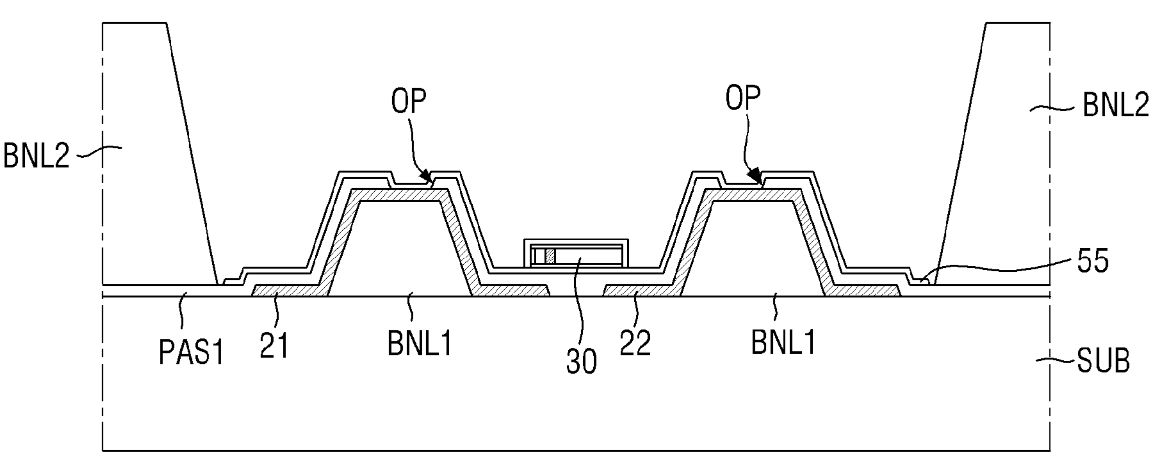

Referring to FIGS. 18 and 19, the process of removing the solvent 220 may be carried out in a chamber VCD of which internal pressure may be adjustable. The chamber VCD may adjust the internal pressure therein, and may remove the solvent 220 by irradiating heat on the target substrate SUB with the pressure adjusted.

According to the method of fabricating the display device 10, it may be possible to completely remove the solvent 220 by heat treatment in a low-pressure environment. According to an embodiment of the disclosure, the process of removing the solvent 220 may be carried out under a pressure of about $10^{-4}$ Torr to 1 Torr at a temperature of about 25° C. to about 150° C. In case that a heat treatment process is carried out under the above pressure ranges, the boiling point of the solvent 220 may be also lowered, so that it can be more easily removed. The heat treatment process in the chamber VCD may be carried out for 1 minute to 30 minutes. It is, however, to be understood that the disclosure is not limited thereto.

In case that the light-emitting elements 30 are seated on the first passivation layer PAS1 before the solvent 220 may be removed, the polymer resins 250 may be formed to surround the light-emitting elements 30. During the process of removing the solvent 220, in case that the heat treatment process may be performed, the polymer resins 250 may be baked simultaneously, so that the first organic layer 55 may be formed. The first organic layer 55 may be formed on the first passivation layer PAS1 and may be formed to completely surround the light-emitting elements 30.

Subsequently, a second organic layer 58 may be formed on the first organic layer 55, and a mask pattern MP may be formed on the second organic layer 58, so that the first organic layer 55 and the second organic layer 58 may be etched simultaneously (step S500).

Figure 20:
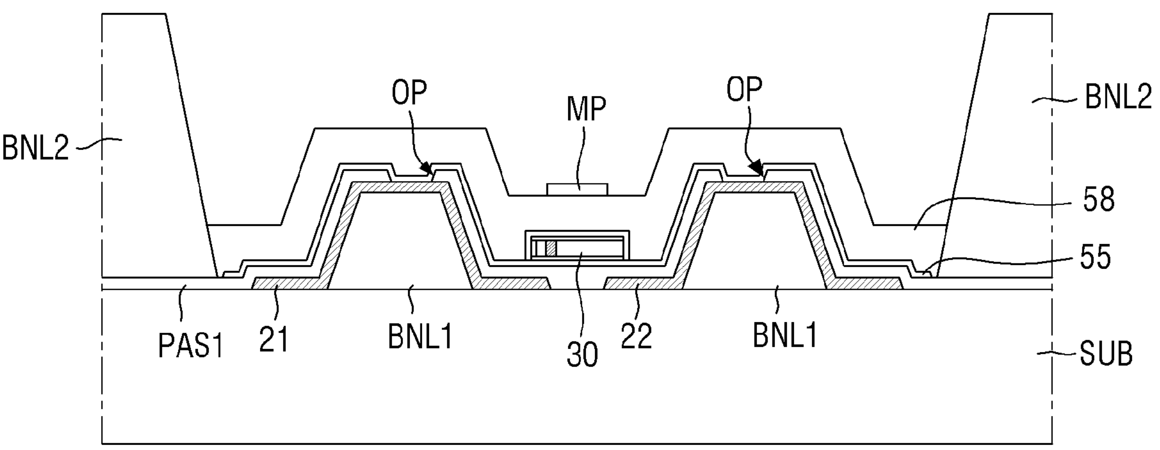
Figure 21:
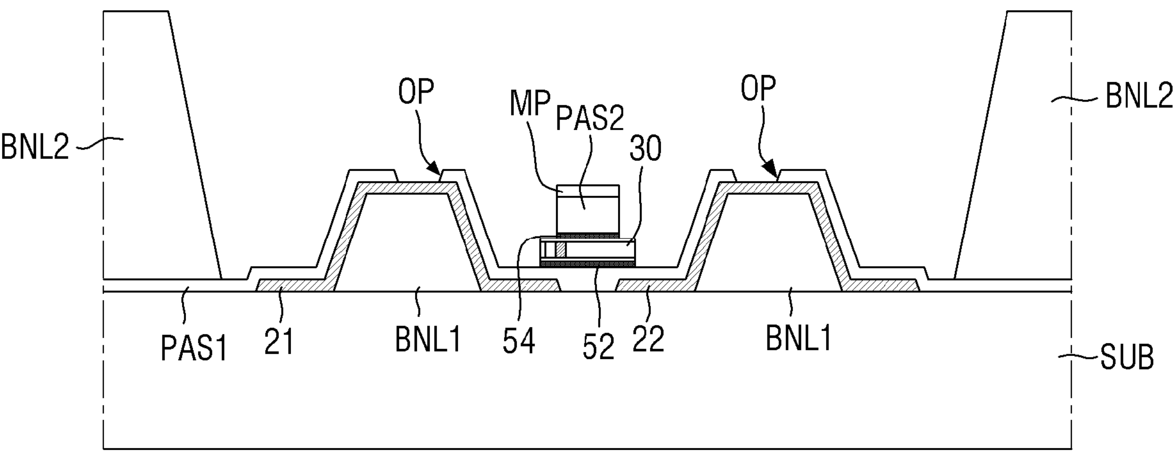
Figure 22:
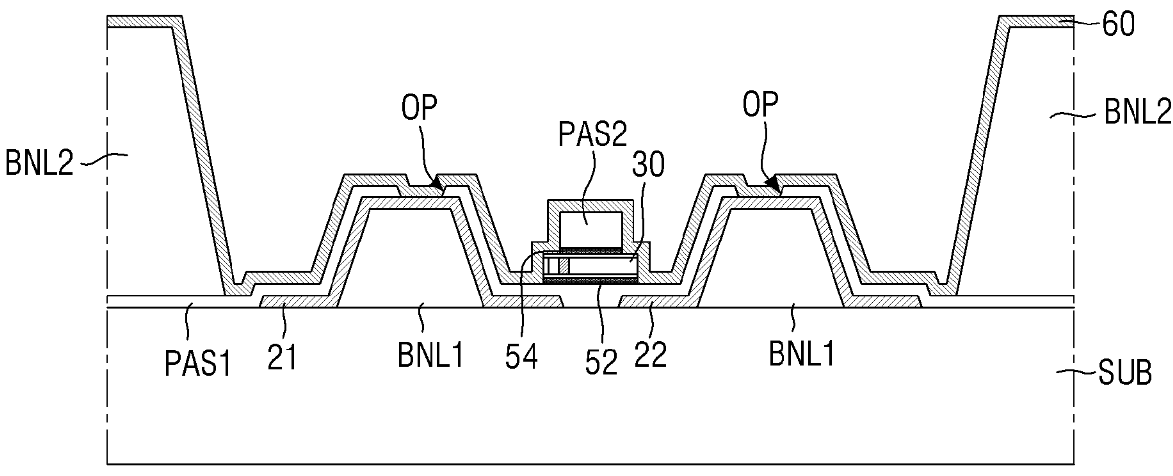
Figure 23:
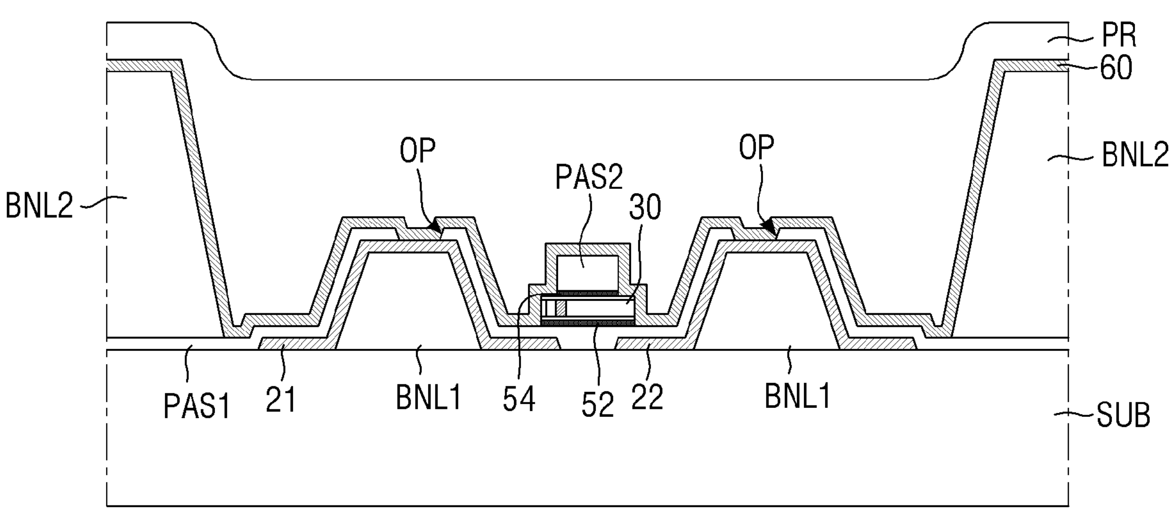
Figure 24:
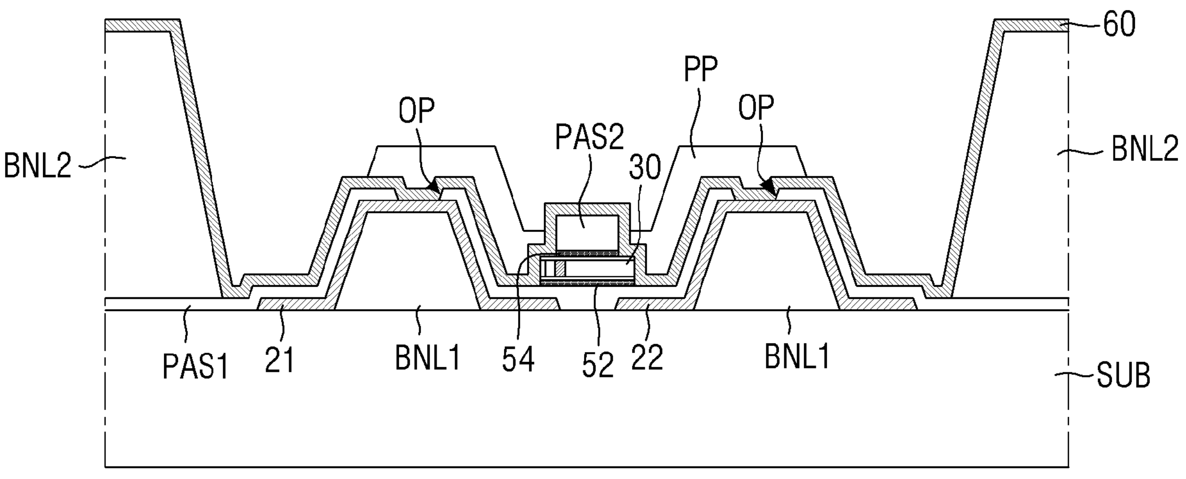

Referring to FIGS. 20 and 21, the second organic layer 58 may be formed on the first organic layer 55. The second organic layer 58 may be formed of the same material as or a different material from that of the first organic layer 55. The mask pattern MP may be formed on the second organic layer 58. The mask pattern MP may be formed so that it overlaps a portion of the light-emitting element 30. The mask pattern MP may be formed as a hard mask such as ITO.

Subsequently, the first organic layer 55 and the second organic layer 58 may be simultaneously etched by performing a dry etching process using the mask pattern MP. By this etching process, parts of the second organic layer 58 that do not overlap the mask pattern MP may be all etched out. The mask pattern MP and the light-emitting elements 30 may work as a mask, so that the first organic layer 55 may be etched out leaving its parts under the mask pattern MP and the light-emitting element 30. Subsequently, the mask pattern MP may be removed, and accordingly the first organic insulating layer 52 disposed under the light-emitting elements 30, the second organic insulating layer 54 disposed on the light-emitting elements 30, and the second passivation layer PAS2 disposed on the second organic insulating layer 54 may be formed.

Subsequently, an electrode material layer 60 may be stacked on the first passivation layer PAS1 and the second passivation layer PAS2, and may be etched using a photoresist pattern PP.

Referring to FIGS. 22 to 25, the electrode material layer 60 may be stacked on the first passivation layer PAS1 and the second passivation layer PAS2. The electrode material layer 60 may be in contact with the electrodes 21 and 22 via the openings OP of the first passivation layer PAS1 and in contact with both ends of the light-emitting element 30. Subsequently, a photoresist PR may be coated on the electrode material layer 60, exposed to light and developed to form the photoresist pattern PP. The photoresist pattern PP may be formed so that it overlaps the first banks BNL1 and both ends of the light-emitting element 30 but not with the second passivation layer PAS2.

Figure 25:
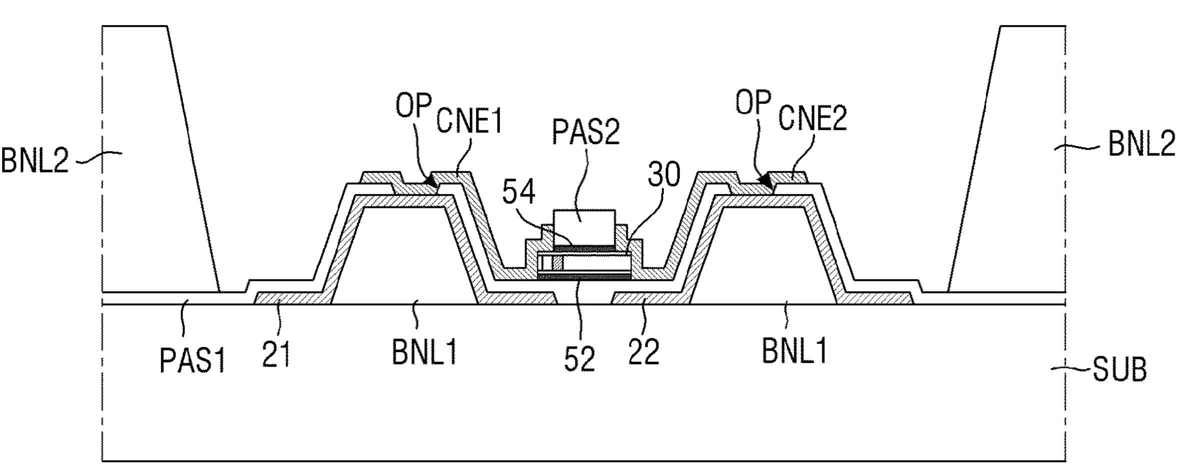

Subsequently, as shown in FIG. 25, by etching the electrode material layer 60 using the photoresist pattern PP, a first contact electrode CNE1 and a second contact electrode CNE2 may be formed. The electrode material layer 60 may be etched on the second passivation layer PAS2 so that the first contact electrode CNE1 and the second contact electrode CNE2 spaced apart from each other may be formed. By performing the above-described processes, the display device 10 including the light-emitting elements 30 can be fabricated.

In concluding the detailed description, those skilled in the art will appreciate that many variations and modifications can be made to the embodiments without substantially departing from the principles of the disclosure. Therefore, the disclosed embodiments are used in a generic and descriptive sense only and not for purposes of limitation.

What is claimed is:

1. An ink comprising:

a solvent;

light-emitting elements included in the solvent, each of the light-emitting elements comprising:

semiconductor layers; and an insulating film at least partially surrounding outer surfaces of the semiconductor layers; and polymer resins included in the solvent, wherein the polymer resins are included in the ink in an amount of about 1 to about 10 parts by weight based on 100 parts by weight of the ink, and the light-emitting elements are included in the ink in an amount of about 0.01 to about 1 parts by weight based on 100 parts by weight of the ink.

2. The ink of claim 1, wherein the polymer resins comprise at least one selected from the group of acrylic-based, epoxy-based, phenol-based, polyamide, polyimide, unsaturated polyester, polyphenylene, polyphenylene sulfide, benzocyclobutene, cardo, siloxane, silsesquioxane, polymethyl methacrylate, and polycarbonate.

3. A display device comprising:

a substrate;

a first electrode and a second electrode that extend in a direction on the substrate and are spaced apart from each other;

a first passivation layer disposed on the substrate and overlapping the first electrode and the second electrode;

at least one light-emitting element comprising a first semiconductor layer, an emissive layer, and a second semiconductor layer sequentially stacked on each other and an insulating film covering a periphery of at least the emissive layer, the at least one light-emitting element having ends disposed on the first electrode and the second electrode, respectively, the first passivation layer being between the at least one of the light-emitting elements and the first and second electrodes;

a first organic insulating layer disposed between the first passivation layer and the at least one light-emitting element and in contact with the at least one light-emitting element; and a second organic insulating layer disposed on the at least one light-emitting element and in contact with the at least one light-emitting element, wherein a planar size of the first organic insulating layer is larger than a planar size of the at least one light-emitting element.

4. The display device of claim 3, wherein the first organic insulating layer overlaps the at least one light-emitting element.

5. The display device of claim 3, wherein the first organic insulating layer overlaps the at least one light-emitting element in the direction.

6. The display device of claim 3, wherein the first organic insulating layer extends to the first passivation layer and the at least one light-emitting element.

7. The display device of claim 6, wherein the at least one light-emitting element is spaced apart from the first passivation layer.

8. The display device of claim 6, wherein at least a portion of the at least one light-emitting element extends to the first passivation layer, and another portion of the at least one light-emitting element extends to the first organic insulating layer.

9. The display device of claim 3, wherein the second organic insulating layer overlaps the first organic insulating layer and the at least one light-emitting element, and extends to the at least one light-emitting element.

10. The display device of claim 9, wherein the second organic insulating layer continuously overlaps the at least one light-emitting element in the direction.

11. The display device of claim 3, wherein a width of portions of the first organic insulating layer that overlap the at least one light-emitting element is larger than a width of the second organic insulating layer in a longitudinal direction of the at least one light-emitting element.

12. The display device of claim 3, further comprising:

a second passivation layer disposed on the second organic insulating layer, wherein the second organic insulating layer and the second passivation layer overlap each other and have a same size.

13. The display device of claim 3, wherein the first organic insulating layer and the second organic insulating layer are made of a same material.

14. The display device of claim 3, further comprising:

a first contact electrode disposed on the first electrode and electrically contacting a first end of the at least one light-emitting element; and a second contact electrode disposed on the second electrode and electrically contacting a second end of the at least one light-emitting element.

15. The display device of claim 14, further comprising:

a second passivation layer disposed on the second organic insulating layer, wherein the first contact electrode extends to an end of each of the second organic insulating layer and the second passivation layer, the second contact electrode extends to another end of each of the second organic insulating layer and the second passivation layer, and the first contact electrode and the second contact electrode do not extend to an upper surface of the second passivation layer.

16. A method of fabricating a display device, the method comprising:

preparing an ink including a solvent, light-emitting elements, and polymer resins;

forming a first electrode and a second electrode on a substrate;

forming a passivation layer on the first electrode and the second electrode;

ejecting the ink onto the substrate;

applying an electric field over the substrate to align the light-emitting elements on the first electrode and the second electrode;

removing the solvent;

forming a first organic layer surrounding the light-emitting elements;

forming a second organic layer on the first organic layer;

forming a mask pattern on the second organic layer; and etching the first organic layer and the second organic layer, wherein the polymer resins are included in the ink in an amount of about 1 to about 10 parts by weight based on 100 parts by weight of the ink, and the light-emitting elements are included in the ink in an amount of about 0.01 to about 1 parts by weight based on 100 parts by weight of the ink.

17. The method of claim 16, further comprising, after the etching of the first organic layer and the second organic layer:

disposing an electrode material layer on the substrate; and etching the electrode material layer using a photoresist pattern.

18. The method of claim 16, wherein the forming of the first organic layer includes performing heat treatment on the polymer resins.

* * * * *